(12) United States Patent
Mun et al.

(10) Patent No.: US 11,791,002 B2
(45) Date of Patent: Oct. 17, 2023

(54) SEMICONDUCTOR MEMORY DEVICE MAINTAINING VERIFICATION DATA DURING PROGRAM SUSPEND, AND METHOD OF OPERATING THE SEMICONDUCTOR MEMORY DEVICE

(71) Applicant: SK hynix Inc., Icheon-si (KR)

(72) Inventors: Yeong Jo Mun, Icheon-si (KR); Dong Hun Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/882,295

(22) Filed: Aug. 5, 2022

(65) Prior Publication Data
US 2023/0298679 A1    Sep. 21, 2023

(30) Foreign Application Priority Data
Mar. 18, 2022 (KR) .......................... 10-2022-0034320

(51) Int. Cl.
*G11C 16/10* (2006.01)
*G11C 16/34* (2006.01)

(52) U.S. Cl.
CPC ........ *G11C 16/3459* (2013.01); *G11C 16/102* (2013.01); *G11C 16/3404* (2013.01)

(58) Field of Classification Search
CPC .............. G11C 16/3459; G11C 16/102; G11C 16/3404
See application file for complete search history.

(56) References Cited

U.S. PATENT DOCUMENTS

| | | | |
|---|---|---|---|
| 9,135,989 B2 | 9/2015 | Sakai et al. | |
| 10,276,244 B2 | 4/2019 | Iwasaki et al. | |
| 11,315,650 B2* | 4/2022 | Kim | ...................... G11C 16/26 |
| 2020/0387329 A1* | 12/2020 | Choi | ................... G11C 11/5628 |

FOREIGN PATENT DOCUMENTS

| | | |
|---|---|---|
| KR | 1020180081956 A | 7/2018 |
| KR | 1020200139496 A | 12/2020 |
| KR | 1020220001137 A | 1/2022 |

* cited by examiner

*Primary Examiner* — Xiaochun L Chen
(74) *Attorney, Agent, or Firm* — WILLIAM PARK & ASSOCIATES LTD.

(57) ABSTRACT

A method of operating a semiconductor memory device includes starting a program operation on selected memory cells using a main verification voltage and an auxiliary verification voltage in response to a program command, receiving a program suspend command during the program operation, and changing at least one auxiliary voltage verification result information among threshold voltage states which are not program-passed to at least one data pattern among threshold voltage states which program-passed, in response to the program suspend command.

20 Claims, 25 Drawing Sheets

| Vth | LAT1 | LAT2 | LAT3 |
|---|---|---|---|
| Va0 | 0 | 0 | X |

| Vth | LAT1 | LAT2 | LAT3 |
|-----|------|------|------|
| Vb0 | 1 | 1 | 0 |
| Vb1 | 1 | 1 | 1 |
| Vb2 | 0 | 0 | X |

| Vth | LAT1 | LAT2 | LAT3 |
|---|---|---|---|
| Vc0 | 1 | 0 | 0 |
| Vc1 | 1 | 0 | 1 |
| Vc2 | 0 | 0 | X |

| Vth | LAT1 | LAT2 | LAT3 |
|-----|------|------|------|
| Vd0 | 0 | 1 | 0 |
| Vd1 | 0 | 1 | 1 |
| Vd2 | 0 | 0 | X |

| Vth | LAT1 | LAT2 | LAT3 |
|---|---|---|---|
| Vc0 | 1 | 0 | 0 |
| Vc1 | 1 | 0 | 1 |
| Vc2 | 0 | 0 | X |

⇓ S170

| Vth | LAT1 | LAT2 | LAT3 |
|---|---|---|---|
| Vc0 | 1 | 0 | 0 |
| Vc1 | 1 | 1 | 1 |
| Vc2 | 0 | 0 | X |

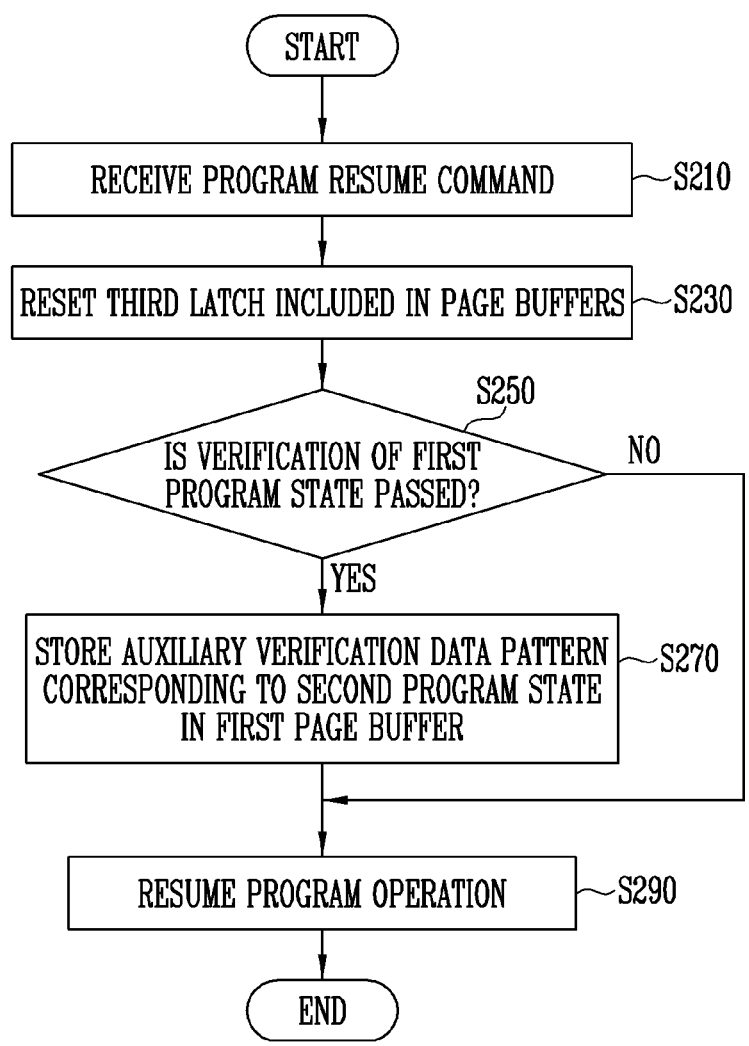

FIG. 16

| Vth | LAT1 | LAT2 | LAT3 |
|-----|------|------|------|
| Vc0 | 1 | 0 | X |
| Vc1 | 1 | 1 | X |
| Vc2 | 0 | 0 | X |

⇓ S230

| Vth | LAT1 | LAT2 | LAT3 |
|-----|------|------|------|
| Vc0 | 1 | 0 | 0 |
| Vc1 | 1 | 1 | 0 |
| Vc2 | 0 | 0 | 0 |

⇓ S270

| Vth | LAT1 | LAT2 | LAT3 |
|-----|------|------|------|
| Vc0 | 1 | 0 | 0 |
| Vc1 | 1 | 0 | 1 |
| Vc2 | 0 | 0 | 0 |

FIG. 17B

| Vth | LAT1 | LAT2 | LAT3 |
|---|---|---|---|
| Vd0 | 0 | 1 | 0 |
| Vd1 | 0 | 1 | 1 |
| Vd2 | 0 | 0 | X |

⇓ S370

| Vth | LAT1 | LAT2 | LAT3 |
|---|---|---|---|
| Vd0 | 0 | 1 | 0 |
| Vd1 | 1 | 0 | 1 |
| Vd2 | 0 | 0 | X |

FIG. 18B

| Vth | LAT1 | LAT2 | LAT3 |
|-----|------|------|------|
| Vd0 | 0    | 1    | X    |
| Vd1 | 1    | 0    | X    |
| Vd2 | 0    | 0    | X    |

⇓ S430

| Vth | LAT1 | LAT2 | LAT3 |
|-----|------|------|------|
| Vd0 | 0    | 1    | 0    |
| Vd1 | 1    | 0    | 0    |
| Vd2 | 0    | 0    | 0    |

⇓ S470

| Vth | LAT1 | LAT2 | LAT3 |
|-----|------|------|------|
| Vd0 | 0    | 1    | 0    |
| Vd1 | 0    | 1    | 1    |
| Vd2 | 0    | 0    | 0    |

SEMICONDUCTOR MEMORY DEVICE MAINTAINING VERIFICATION DATA DURING PROGRAM SUSPEND, AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2022-0034320 filed on Mar. 18, 2022, in the Korean Intellectual Property Office, the entire disclosure of which is incorporated by reference herein.

BACKGROUND

1. Technical Field

The present disclosure relates to a semiconductor memory device, and more particularly, to a semiconductor memory device configured to maintain verification data during program suspend, and a method of operating the semiconductor memory device.

2. Related Art

A memory device may be formed in a two-dimensional structure in which strings are horizontally arranged on a semiconductor substrate, or may be formed in a three-dimensional structure in which the strings are vertically stacked on the semiconductor substrate. A three-dimensional memory device is a memory device designed to resolve a limit of an integration degree of a two-dimensional memory device, and may include a plurality of memory cells that are vertically stacked on a semiconductor substrate.

SUMMARY

According to an embodiment of the present disclosure, a method of operating a semiconductor memory device includes starting a program operation on selected memory cells using a main verification voltage and an auxiliary verification voltage in response to a program command, receiving a program suspend command during the program operation, and changing at least one auxiliary voltage verification result information among threshold voltage states which are not program-passed to at least one data pattern among threshold voltage states which program-passed, in response to the program suspend command.

According to another embodiment of the present disclosure, a method of operating a semiconductor memory device including memory cells each storing an N-bit includes receiving a program resume command, determining whether a k-th program state among first to $(2^N-1)$-th program states is verification-passed, and identifying page buffers corresponding to memory cells having a threshold voltage between an x-th auxiliary verification voltage and an x-th main verification voltage among memory cells to be programmed to an x-th program state, and storing an auxiliary verification data pattern corresponding to the x-th program state in the identified page buffers. Here, N is an integer greater than 1, k is an integer greater than 1 and less than or equal to $2^N-2$, and x is an integer greater than k and less than or equal to $2^N-1$.

According to still another embodiment of the present disclosure, a semiconductor memory device includes a memory cell array, a peripheral circuit, and a control logic. The memory cell array includes a plurality of memory cells each storing an N-bit. The peripheral circuit performs a program operation on the memory cell array. The control logic controls the program operation of the peripheral circuit. The control logic controls the peripheral circuit to change auxiliary voltage verification result information corresponding to an x-th threshold voltage state that is not program-passed among first to $(2^N-1)$-th program states to a k-th data pattern corresponding to a k-th program state that is program-passed among the first to $(2^N-1)$-th program states, when a program suspend command is received during a program operation on selected memory cells among the plurality of memory cells. Here, N is an integer greater than 1, k is an integer greater than 1 and less than or equal to $2^N-2$, and x is an integer greater than k and less than or equal to $2^N-1$.

BRIEF DESCRIPTION OF THE DRAWINGS

FIG. 15 is a flowchart illustrating a method of operating a semiconductor memory device according to an embodiment of the present disclosure when a program resume command is received.

FIG. 16 is a diagram illustrating the method according to FIG. 15 in more detail.

FIG. 17B is a diagram illustrating the method according to FIG. 17A in more detail.

FIG. 18B is a diagram illustrating the method according to FIG. 18A in more detail.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a semiconductor memory device and a method of operating the semiconductor memory device capable of maintaining auxiliary verification data using a minimum latch during program suspend.

The present technology, in an embodiment, may provide a semiconductor memory device and a method of operating the semiconductor memory device capable of maintaining auxiliary verification data during program suspend, using a minimum latch.

Figure 1:
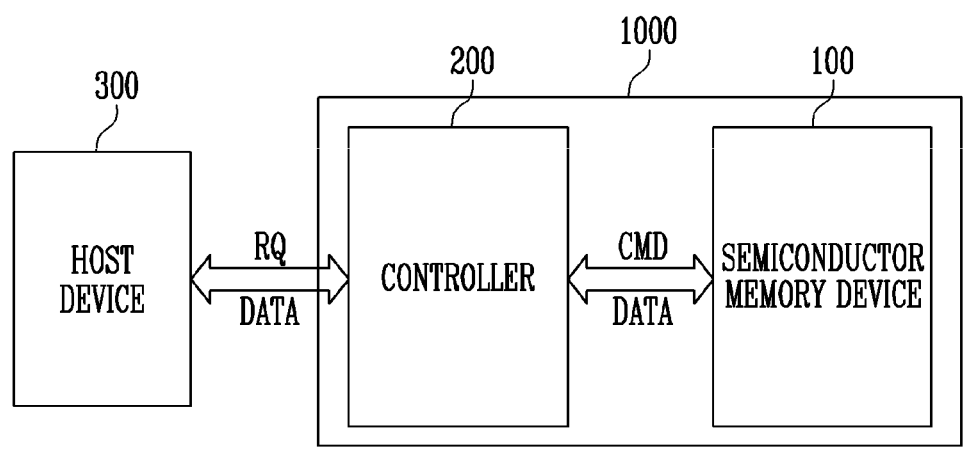
FIG. 1 is a block diagram illustrating a storage device and a host device according to an embodiment of the present disclosure.

FIG. 1 is a block diagram illustrating a storage device 1000 and a host device 300 according to an embodiment of the present disclosure.

Referring to FIG. 1, the storage device 1000 includes a semiconductor memory device 100 and a controller 200. In addition, the storage device 1000 communicates with the host device 300. The controller 200 controls an overall operation of the semiconductor memory device 100. In addition, the controller 200 controls the operation of the semiconductor memory device 100 based on an operation request received from the host device 300.

The semiconductor memory device 100 operates in response to control of the controller 200. The semiconductor memory device 100 includes a memory cell array having a plurality of memory blocks. As an embodiment, the semiconductor memory device 100 may be a flash memory device.

The controller 200 may exchange data DATA based on a request RQ from the host device 300. Specifically, the controller 200 may receive a write request, a read request, a trim request, or the like of the host device 300, and control the semiconductor memory device 100 based on the received requests. More specifically, the controller 200 may generate commands CMD for controlling an operation of the semiconductor memory device 100 and transmit the command CMD to the semiconductor memory device 100. Meanwhile, the controller 200 may exchange the data DATA with the semiconductor memory device 100.

The semiconductor memory device 100 is configured to receive a command and an address from the controller 200 and access an area selected by the address in the memory cell array. That is, the semiconductor memory device 100 performs an internal operation corresponding to the command with respect to the area selected by the address.

For example, the semiconductor memory device 100 may perform a program operation, a read operation, and an erase operation. During the program operation, the semiconductor memory device 100 may program data in the area selected by the address. During the read operation, the semiconductor memory device 100 may read data from the area selected by the address. During the erase operation, the semiconductor memory device 100 may erase data stored in the area selected by the address.

The controller 200 of the storage device 1000 may control a garbage collection operation of the semiconductor memory device 100. For the garbage collection operation, the controller 200 of the storage device 1000 may control the semiconductor memory device 100 to read valid data programmed in a victim block of the memory cell array and program the read data to a target block of the memory cell array. The garbage collection operation may be performed as a background operation of the storage device 1000.

The storage device 1000 according to an embodiment of the present disclosure may support program suspend and program resume functions related to the program operation of the semiconductor memory device 100. For example, while the semiconductor memory device performs the program operation as a detailed operation of the garbage collection operation, the read request may be transmitted from the host device 300 to the storage device 1000. In this case, the controller 200 may control the semiconductor memory device 100 to stop the program operation which is being performed and to perform the read operation corresponding to the read request received from the host device 300. More specifically, the controller 200 may transmit a program suspend command to the semiconductor memory device 100 in response to the received read request. The semiconductor memory device 100 may stop the program operation which is being performed in response to the received program suspend command. Thereafter, the controller 200 may transmit a read command corresponding to the read request received from the host device 300 to the semiconductor memory device 100. The semiconductor memory device 100 may perform the read operation corresponding to the received read command. After read data is transmitted from the semiconductor memory device 100 to the controller 200, the controller 200 may transmit a program resume command to the semiconductor memory device 100. The semiconductor memory device 100 may resume the stopped program operation, in response to the received program resume command.

Figure 2:
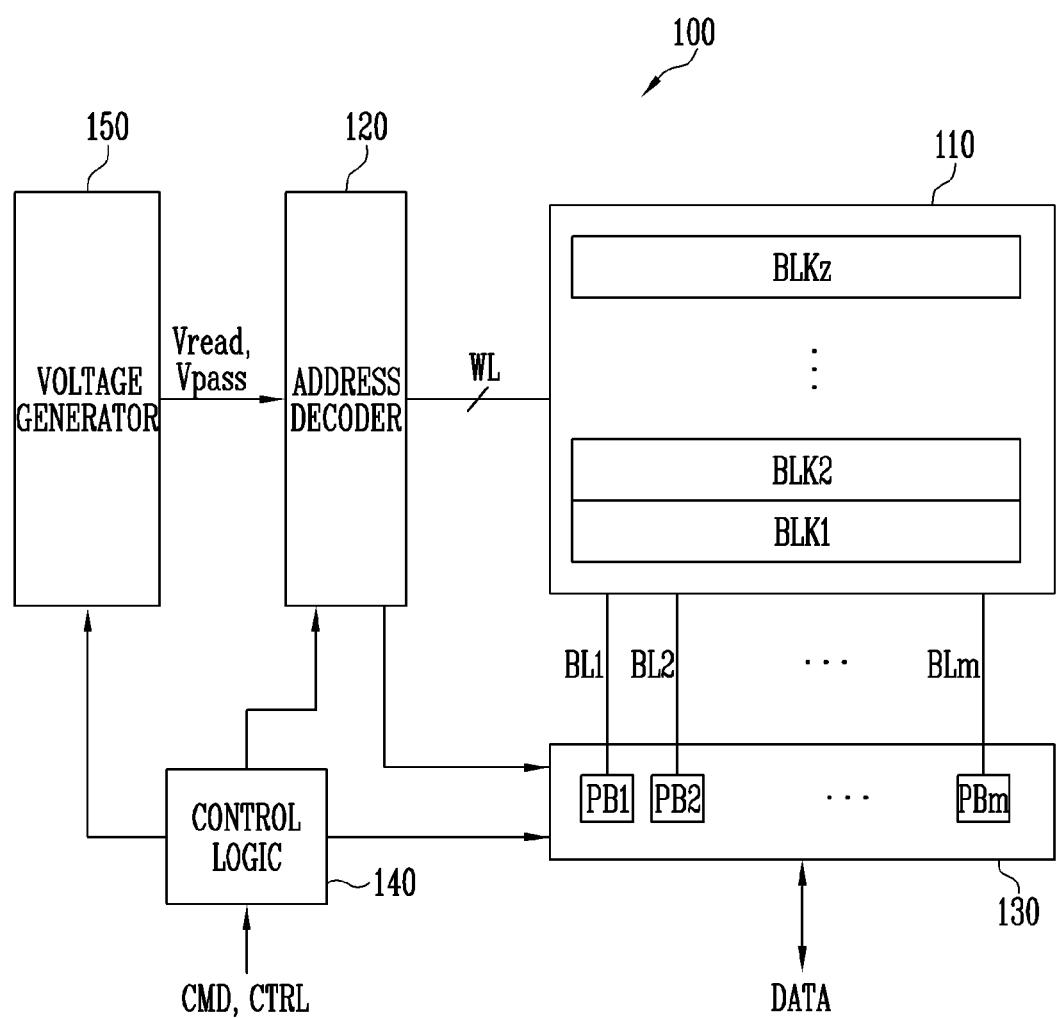
FIG. 2 is a block diagram illustrating a semiconductor memory device according to FIG. 1.

FIG. 2 is a block diagram illustrating a semiconductor memory device according to an embodiment of the present disclosure.

Referring to FIG. 2, the semiconductor memory device 100 includes a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during a read operation, and applies a pass voltage Vpass to the remaining unselected word lines. In addition, the address decoder 120 applies a verification voltage generated by the voltage generator 150 to the selected word line among the selected memory block and applies the pass voltage Vpass to the remaining unselected word lines during a program verification operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verification operation, in order to sense a threshold voltage of the memory cells, the plurality of page buffers PB1 to PBm sense a change of an amount of a current flowing according to a program status of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. As an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs the read operation, the write operation, and the erase operation on the memory cell array 110. The peripheral circuit performs the read operation, the write operation, and the erase operation on the memory cell array 110 based on the control of the control logic 140.

Figure 3:
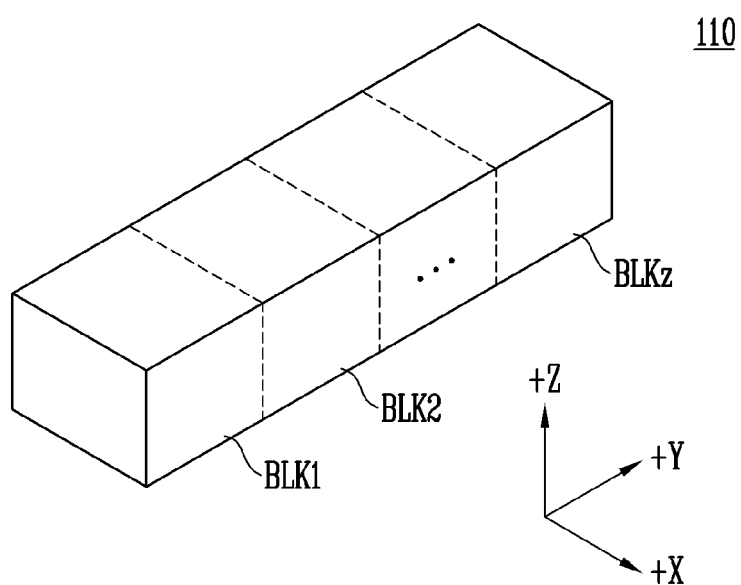
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block having a three-dimensional structure is described in more detail with reference to FIG. 4.

Figure 4:
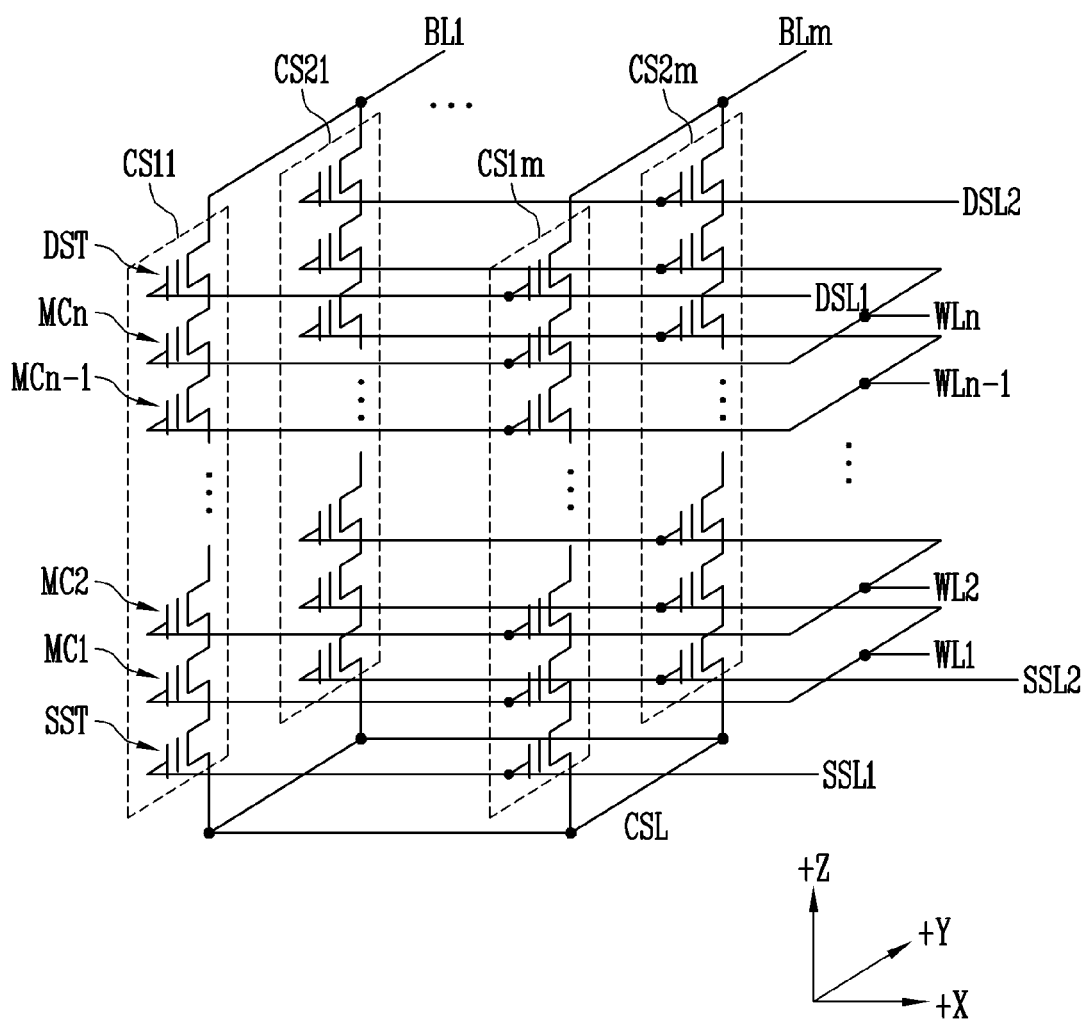
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1$m$ and CS21 to CS2$m$. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1$m$ of a first row are connected to a first source select line SSL1. The source select transistors of the cell strings CS21 to CS2$m$ of a second row are connected to a second source select line SSL2.

As another embodiment, the source select transistors of the cell strings CS11 to CS1$m$ and CS21 to CS2$m$ may be commonly connected to one source select line.

The first to n-th memory cells MC1 to MCn of each cell string are connected in series between the source select transistor SST and the drain select transistor DST. Gates of the first to n-th memory cells MC1 to MCn are connected to the first to n-th word lines WL1 to WLn, respectively.

The drain select transistor DST of each cell string is connected between a corresponding bit line and the memory cells MC1 to MCn. The drain select transistors DST of the cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1$m$ and CS2$m$ of the m-th column are connected to the m-th bit line BLm.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1$m$ or CS21 to SC2$m$ arranged in the row direction may be connected to even bit lines, and odd-numbered cell strings among the cell strings CS11 to CS1$m$ or CS21 to CS2$m$ arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one or more dummy memory cells, each of the dummy memory cells may have a required threshold voltage. Program operations on all or some of the dummy memory cells may be performed before or after the erase operation on the memory block BLKa. When the erase operation is performed after the program operation is performed, the dummy memory cells may have a required threshold voltage by controlling a voltage applied to dummy word lines connected to the respective dummy memory cells.

Figure 5:
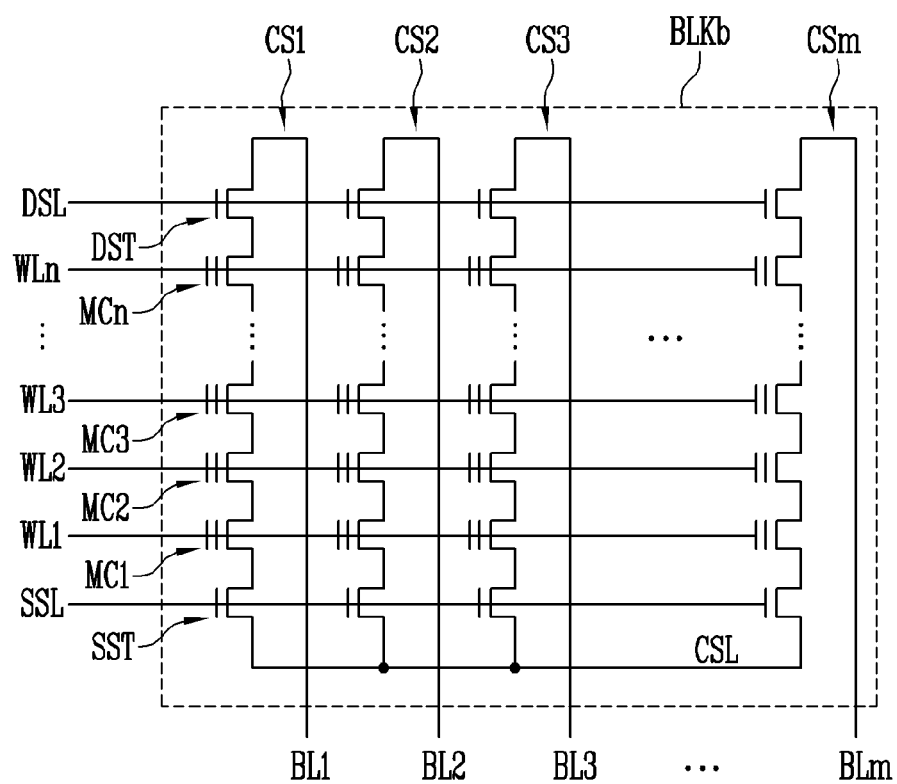
FIG. 5 is a circuit diagram illustrating an embodiment of any one memory block BLKb among the plurality of memory blocks BLK1 to BLKz included in the memory cell array of FIG. 2.

FIG. 5 is a circuit diagram illustrating an embodiment of any one memory block BLKb among the plurality of memory blocks BLK1 to BLKz included in the memory cell array 110 of FIG. 2.

Referring to FIG. 5, the memory block BLKb includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. The source select transistor SST of the cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

As another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

As shown in FIGS. 3 and 4, the memory blocks BLK1 to BLKz of the semiconductor memory device 100 may be configured as memory blocks having a three-dimensional structure. However, the present disclosure is not limited thereto, and as shown in FIG. 5, the memory blocks BLK1 to BLKz of the semiconductor memory device 100 may be configured as memory blocks having a two-dimensional structure.

Figure 6:
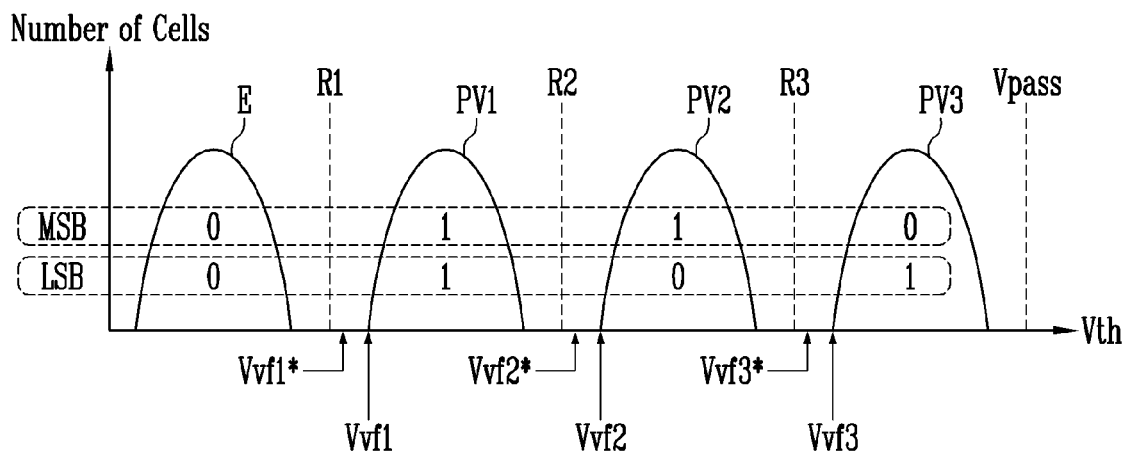
FIG. 6 is a diagram illustrating a threshold voltage distribution of a multi-level cell (MLC), and a main verification voltage and an auxiliary verification voltage for forming the threshold voltage distribution.

FIG. 6 is a diagram illustrating a threshold voltage distribution of a multi-level cell (MLC), and a main verification voltage and an auxiliary verification voltage for forming the threshold voltage distribution.

Referring to FIG. 6, a data pattern stored in the MLC and a threshold voltage distribution of target states corresponding thereto are shown, for example. The MLC stores two bits of data including a most significant bit (MSB) and a least significant bit (LSB). In an example of FIG. 6, a memory cell corresponding to an erase state E stores a data pattern of "0 0", a memory cell corresponding to a first program state PV1 stores a data pattern of "1 1", a memory cell corresponding to a second program state PV2 stores a data pattern of "1 0", and a memory cell corresponding to a third program state PV3 stores a data pattern of "0 1". In order to read data of the MLC, first to third read voltages R1 to R3 may be used. Meanwhile, a pass voltage Vpass is applied to an unselected word line.

During a program verification operation, main verification voltages Vvf1, Vvf2, and Vvf3 and auxiliary verification voltages Vvf1*, Vvf2*, and Vvf3* may be used. The auxiliary verification voltages Vvf1*, Vvf2*, and Vvf3* may be voltages for distinguishing memory cells near the main verification voltages Vvf1, Vvf2, and Vvf3 corresponding to the target state. By lowering a threshold voltage shift width of the memory cells near the main verification voltages Vvf1, Vvf2, and Vvf3, a threshold voltage distribution width of each of the program states PV1, PV2, and PV3 may be narrowed. Hereinafter, the present disclosure is described in more detail with reference to FIGS. 7 to 11B.

Figure 7:
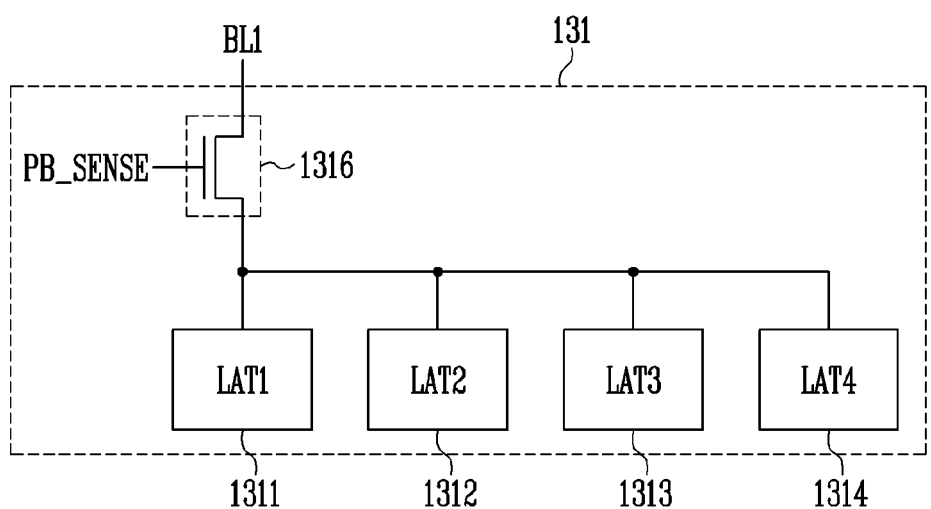
FIG. 7 is a diagram schematically illustrating a page buffer according to an embodiment of the present disclosure.

FIG. 7 is a diagram schematically illustrating a page buffer 131 according to an embodiment of the present disclosure. Specifically, the page buffer 131 is an embodiment of the page buffer PB1 connected to the first bit line BL1 among the page buffers PB1 to PBm shown in FIG. 2. Other page buffers PB2 to PBm may also be configured similarly to the page buffer 131 shown in FIG. 7.

Referring to FIG. 7, the page buffer 131 may include a plurality of latches 1311 and 1312 for storing program data input from the outside during the program operation. For example, in the embodiment shown in FIG. 7, the page buffer 131 may store two bits of data. In this case, a first latch LAT1; 1311 may store an MSB, and a second latch LAT2; 1312 may store an LSB. Until program of memory cell connected to the first bit line BL1 is completed, the first and second latches 1311 and 1312 may maintain a stored data pattern.

Meanwhile, the page buffer 131 may further include a third latch LAT3; 1313 and a fourth latch LAT4; 1314. The third latch LAT3; 1313 may store data indicating an auxiliary verification result of the memory cell connected to the first bit line BL1. The fourth latch LAT4; 1314 may be used for a sensing operation of the first bit line BL1 for a verification operation.

Meanwhile, the page buffer 131 may include a bit line connection transistor 1316 that controls connection between the bit line BL and the latches 1311, 1312, 1313, and 1314. The bit line connection transistor 1316 is controlled by a bit line connection signal PB_SENSE. For example, when reading data from the memory cell, the bit line connection transistor 1316 is turned on to electrically connect the bit line BL and the fourth latch 1314.

In a verification process of the program operation of the memory cell, a value indicating whether a threshold voltage of the memory cell connected to the first bit line BL1 is greater than the auxiliary verification voltage corresponding to the target state may be stored in the third latch 1313. For example, when the threshold voltage of the memory cell connected to the first bit line BL1 is less than the auxiliary verification voltage corresponding to the target state, a value of "0" may be stored in the third latch 1313. While the value of "0" is stored in the third latch 1313, a first program allowable voltage is applied to the first bit line BL1 when a program pulse is applied. Meanwhile, as a program process proceeds, when the threshold voltage of the memory cell connected to the first bit line BL1 is greater than the auxiliary verification voltage corresponding to the target state, a value of "1" may be stored in the third latch 1313. When the value of "1" is stored in the third latch 1313, a second program allowable voltage higher than the first program allowable voltage is applied to the first bit line BL1 when a program pulse is applied in a subsequent program loop. Accordingly, when the value of "1" is stored in the third latch 1313, the threshold voltage shift width of the memory cell connected to the first bit line BL1 is reduced in the subsequent program loop.

Meanwhile, as the program process proceeds, when the threshold voltage of the memory cell connected to the first bit line BL1 is greater than the main verification voltage corresponding to the target state, a data pattern stored in the first and second latches 1311 and 1312 may be changed to a data pattern corresponding to the erase state E. For example, as described with reference to FIG. 6, since the data pattern corresponding to the erase state E is "0 0", the data pattern stored in the first latch 1311 and the second latch 1312 may be changed to "0 0". When the data pattern stored in the first latch 1311 and the second latch 1312 is "0 0", a program inhibition voltage is applied to the first bit line BL1 when the program pulse is applied in a subsequent program loop. Accordingly, the threshold voltage of the memory cell connected to the first bit line BL1 is maintained in the subsequent program loop.

Hereinafter, the present disclosure is described in more detail with reference to FIGS. 8A to 11B.

Figures 8A, 8B:
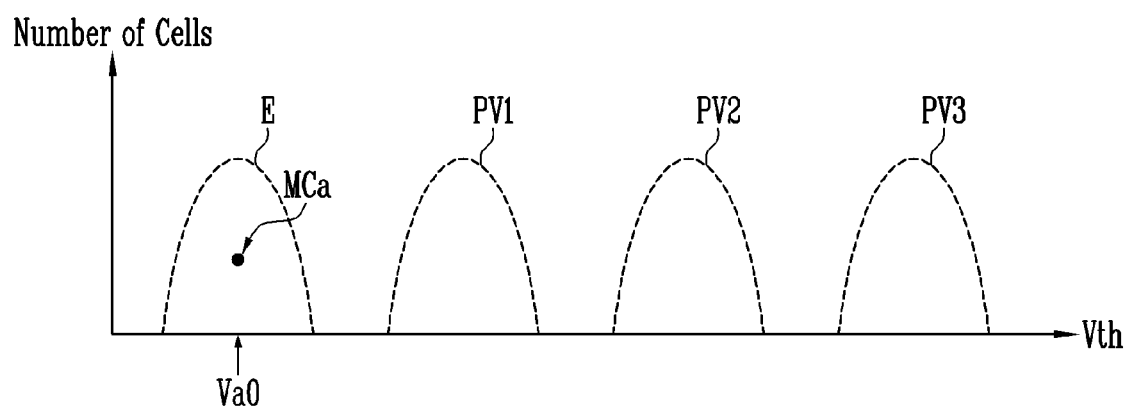
FIGS. 8A and 8B are diagrams illustrating a threshold voltage of a memory cell corresponding to an erase state and data of latches.

FIGS. 8A and 8B are diagrams illustrating a threshold voltage of a memory cell corresponding to the erase state E and data of latches. FIG. 8A shows a threshold voltage of a memory cell MCa corresponding to the erase state E, and FIG. 8B shows data of latches LAT1 to LAT3 in a page buffer connected to the memory cell MCa corresponding to the erase state E.

Referring to FIG. 8A, the threshold voltage of the memory cell MCa storing "0 0" which is the data pattern corresponding to the erase state E is shown. Initially, the threshold voltage of the memory cell MCa is Va0. Meanwhile, referring to FIG. 8B, data "0 0" is stored in the first and second latches 1311 and 1312 in the page buffer connected to the memory cell MCa. As described above, when the data pattern stored in the first latch 1311 and the second latch 1312 is "0 0", the threshold voltage of the memory cell is maintained in a subsequent program loop. Accordingly, even though a program process is performed, the threshold voltage of the memory cell MCa might not increase. Meanwhile, it does not matter what value is stored in the third latch LAT3 indicating an auxiliary verification result. That is, a bit of the third latch LAT3 in the page buffer connected to the memory cell MCa corresponding to the erase state E may be a "don't care bit".

Figures 9A, 9B:
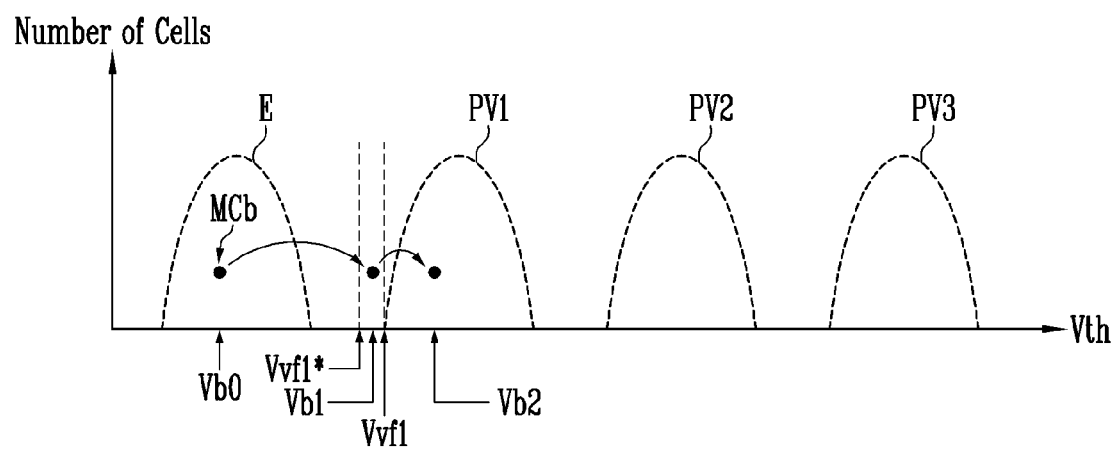
FIGS. 9A and 9B are diagrams illustrating a threshold voltage of a memory cell corresponding to a first program state and data of latches.

FIGS. 9A and 9B are diagrams illustrating a threshold voltage of a memory cell corresponding to the first program state PV1 and data of latches. FIG. 9A shows a threshold voltage change of a memory cell MCb targeting the first program state PV1, and FIG. 9B shows a data change of latches LAT1 to LAT3 in a page buffer connected to the memory cell MCb targeting the first program state PV1.

Referring to FIG. 9A, before the program operation, the threshold voltage of the memory cell MCb may be Vb0 and may be included in the erase state E. A data pattern of "1 1" may be stored in the memory cell MCb through the program operation, and thus the memory cell MCb targets the first program state PV1. When the threshold voltage of the memory cell MCb is Vb0, since it is a voltage less than a first auxiliary verification voltage Vvf1* corresponding to the first program state PV1, a bit of "0" is stored in the third latch LAT3. As a result, in a state in which the threshold voltage of the memory cell MCb is Vb0, a data pattern of "1 1" is stored in the first and second latches LAT1 and LAT2, and a bit of "0" is stored in the third latch LAT3.

As the program operation proceeds, the threshold voltage of the memory cell MCb may gradually increase. As shown in FIG. 9A, as the program operation proceeds, the threshold voltage of the memory cell MCb may become Vb1. Vb1 is a voltage greater than the first auxiliary verification voltage Vvf1* and less than a first main verification voltage Vvf1. In this case, since the threshold voltage of the memory cell MCb is greater than the first auxiliary verification voltage Vvf1*, the bit stored in the third latch LAT3 is changed from "0" to "1". As a result, in a state in which the threshold voltage of the memory cell MCb is Vb1, the data pattern of "1 1" is stored in the first and second latches LAT1 and LAT2, and a bit of "1" is stored in the third latch LAT3.

As the program operation continuously proceeds, the threshold voltage of the memory cell MCb may further increase. As shown in FIG. 9A, as the program operation proceeds, the threshold voltage of the memory cell MCb may become Vb2. Vb2 is a voltage greater than the first main verification voltage Vvf1. In this case, the threshold voltage of the memory cell MCb reaches the first program state PV1 that is a target and the threshold voltage is not required to be increased any more. Therefore, the data pattern stored in the first and second latches LAT1 and LAT2 is changed to "0 0" identically to the data pattern corresponding to the erase state E. As a result, in a state in which the threshold voltage of the memory cell MCb is Vb2, a data pattern of "0 0" may be stored in the first and second latches LAT1 and LAT2, and the bit of "1" may be stored in the third latch LAT3. However, in this case, since the program of the memory cell MCb is completed, it does not matter what value is stored in the third latch LAT3 indicating an auxiliary verification result of the memory cell MCb. That is, in a state in which the program is completed, the bit of the third latch LAT3 in the page buffer connected to the memory cell MCb may be a "don't care bit".

Figures 10A, 10B:
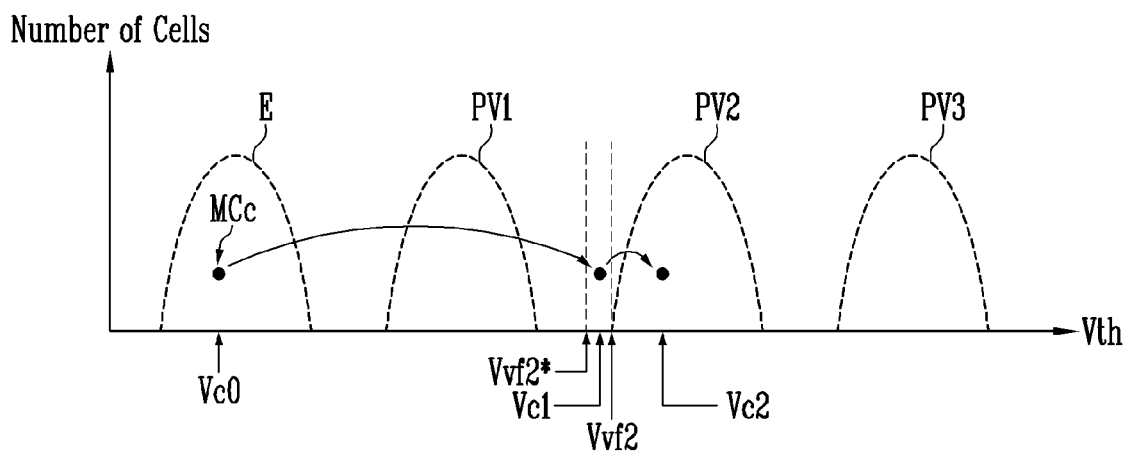
FIGS. 10A and 10B are diagrams illustrating a threshold voltage of a memory cell corresponding to a second program state and data of latches.

FIGS. 10A and 10B are diagrams illustrating a threshold voltage of a memory cell corresponding to the second program state PV2 and data of latches. FIG. 10A shows a threshold voltage change of a memory cell MCc targeting the second program state PV2, and FIG. 10B shows a data change of latches LAT1 to LAT3 in a page buffer connected to the memory cell MCc targeting the second program state PV2.

Referring to FIG. 10A, before the program operation, the threshold voltage of the memory cell MCc may be Vc0 and may be included in the erase state E. A data pattern of "1 0" may be stored in the memory cell MCc through the program operation, and thus the memory cell MCc targets the second program state PV2. When the threshold voltage of the memory cell MCc is Vc0, since it is a voltage less than a second auxiliary verification voltage Vvf2* corresponding to the second program state PV2, a bit of "0" is stored in the third latch LAT3. As a result, in a state in which the threshold voltage of the memory cell MCc is Vc0, a data pattern of "1 0" is stored in the first and second latches LAT1 and LAT2, and a bit of "0" is stored in the third latch LAT3.

As the program operation proceeds, the threshold voltage of the memory cell MCc may gradually increase. As shown in FIG. 10A, as the program operation proceeds, the threshold of the memory cell MCc may be Vc1. Vc1 is a voltage greater than the second auxiliary verification voltage Vvf2* and less than a second main verification voltage Vvf2. In this case, since the threshold voltage of the memory cell MCc is greater than the second auxiliary verification voltage Vvf2*, the bit stored in the third latch LAT3 is changed from "0" to "1". As a result, in a state in which the threshold voltage of the memory cell MCc is Vc1, a data pattern of "1 0" is stored in the first and second latches LAT1 and LAT2, and a bit of "1" is stored in the third latch LAT3.

As the program operation continuously proceeds, the threshold voltage of the memory cell MCc may further increase. As shown in FIG. 10A, as the program operation proceeds, the threshold voltage of the memory cell MCc may become Vc2. Vc2 is a voltage greater than the second main verification voltage Vvf2. In this case, the threshold voltage of the memory cell MCc reaches the second program state PV2 that is a target and the threshold voltage is not required to be increased any more. Therefore, the data pattern stored in the first and second latches LAT1 and LAT2 is changed to "0 0" identically to the data pattern corresponding to the erase state E. As a result, in a state in which the threshold voltage of the memory cell MCc is Vc2, the data pattern of "0 0" may be stored in the first and second latches LAT1 and LAT2, and the bit of "1" may be stored in the third latch LAT3. However, in this case, since the program of the memory cell MCc is completed, it does not matter what value is stored in the third latch LAT3 indicating an auxiliary verification result of the memory cell MCc. That is, in a state in which the program is completed, the bit of the third latch LAT3 in the page buffer connected to the memory cell MCc may be a "don't care bit".

Figures 11A, 11B:
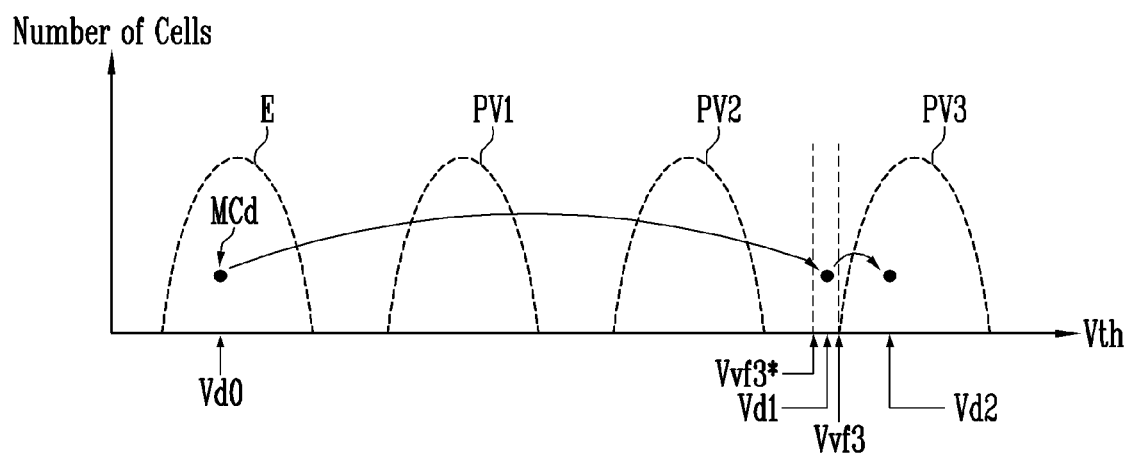
FIGS. 11A and 11B are diagrams illustrating a threshold voltage of a memory cell corresponding to a third program state and data of latches.

FIGS. 11A and 11B are diagrams illustrating a threshold voltage of a memory cell corresponding to the third program state PV3 and data of latches. FIG. 11A shows a threshold voltage change of a memory cell MCd targeting the third program state PV3, and FIG. 11B shows a data change of latches LAT1 to LAT3 in a page buffer connected to the memory cell MCd targeting the third program state PV3.

Referring to FIG. 11A, before the program operation, the threshold voltage of the memory cell MCd may be Vd0 and may be included in the erase state E. A data pattern of "0 1" may be stored in the memory cell MCd through the program operation, and thus the memory cell MCd targets the third program state PV3. When the threshold voltage of the memory cell MCd is Vd0, since it is a voltage less than a third auxiliary verification voltage Vvf3* corresponding to the third program state PV3, a bit of "0" is stored in the third latch LAT3. As a result, in a state in which the threshold voltage of the memory cell MCd is Vd0, a data pattern of "0 1" is stored in the first and second latches LAT1 and LAT2, and a bit of "0" is stored in the third latch LAT3.

As the program operation proceeds, the threshold voltage of the memory cell MCd may gradually increase. As shown in FIG. 11A, as the program operation proceeds, the threshold voltage of the memory cell MCd may become Vd1. Vd1 is a voltage greater than the third auxiliary verification voltage Vvf3* and less than a third main verification voltage Vvf3. In this case, since the threshold voltage of the memory cell MCd is greater than the third auxiliary verification voltage Vvf3*, the bit stored in the third latch LAT3 is changed from "0" to "1". As a result, in a state in which the threshold voltage of the memory cell MCd is Vd1, the data pattern of "0 1" is stored in the first and second latches LAT1 and LAT2, and a bit of "1" is stored in the third latch LAT3.

As the program operation continuously proceeds, the threshold voltage of the memory cell MCd may further increase. As shown in FIG. 11A, as the program operation proceeds, the threshold voltage of the memory cell MCd may become Vd2. Vd2 is a voltage greater than the third main verification voltage Vvf3. In this case, the threshold voltage of the memory cell MCd reaches the third program state PV3 that is a target and the threshold voltage is not required to be increased any more. Therefore, the data pattern stored in the first and second latches LAT1 and LAT2 is changed to "0 0" identically to the data pattern corresponding to the erase state E. As a result, in a state in which the threshold voltage of the memory cell MCd is Vd2, the data pattern of "0 0" may be stored in the first and second latches LAT1 and LAT2, and the bit of "1" may be stored in the third latch LAT3. However, in this case, since the program of the memory cell MCd is completed, it does not matter what value is stored in the third latch LAT3 indicating an auxiliary verification result of the memory cell MCd. That is, in a state where the program is completed, the bit of the third latch LAT3 in the page buffer connected to the memory cell MCd may be a "don't care bit".

As described above, the first and second latches LAT1; 1311 and LAT2; 1312 in the page buffer may store a data pattern corresponding to a target program state until the program of the corresponding memory cell is completed. In addition, the third latch LAT3; 1313 in the page buffer stores a bit indicating whether the threshold voltage of the corresponding memory cell is greater than the auxiliary verification voltage corresponding to the target program state.

Figure 12A:
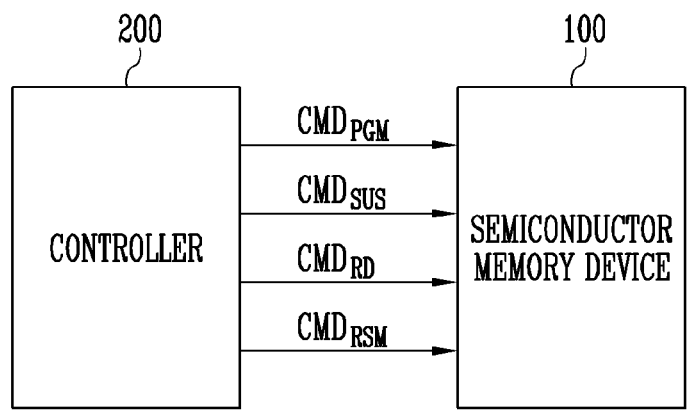
FIGS. 12A and 12B are diagrams illustrating a change of data in a page buffer when a program suspend command is received during a program operation.
Figure 12B:
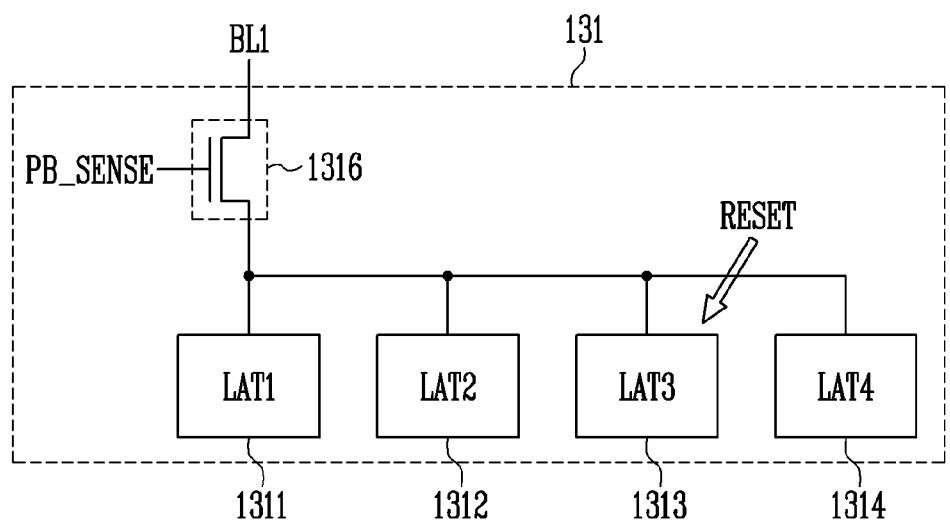

FIGS. 12A and 12B are diagrams illustrating a change of data in the page buffer when the program suspend command is received during the program operation.

Referring to FIG. 12A, the semiconductor memory device 100 may perform the program operation in response to a program command $CMD_{PGM}$ received from the controller 200. Before the program operation of the semiconductor memory device 100 is completed, the controller 200 may require specific data of the semiconductor memory device 100. In this case, the controller 200 transmits a program suspend command $CMD_{SUS}$ to the semiconductor memory device 100. The semiconductor memory device 100 stops the program operation which is being performed in response to the program suspend command $CMD_{SUS}$. In a state in which the semiconductor memory device 100 stops the program operation, the controller 200 transmits a read command $CMD_{RD}$ to the semiconductor memory device 100. The semiconductor memory device 100 reads corresponding data in response to the read command $CMD_{RD}$ and transmits the read data to the controller 200. After the controller 200 receives the data corresponding to the read command $CMD_{RD}$, the controller 200 transmits a program resume command $CMD_{RSM}$ to the semiconductor memory device. The semiconductor memory device 100 resumes the stopped program operation, in response to the program resume command $CMD_{RSM}$.

Referring to FIG. 12B, when the program suspend command is received, the first and second latches LAT1; 1311 and LAT2; 1312 maintain a stored data pattern. This is to resume the stopped program operation when the program resume command is received thereafter. Meanwhile, when the program suspend command is received, the third latch LAT3; 1313 is reset. This is because the third latch LAT3; 1313 is used for the read operation. Since the third latch is reset when receiving the program suspend command, data indicating a previously stored auxiliary verification result is removed from the page buffer. Thereafter, when the program operation is resumed, a corresponding auxiliary verification operation is required to be performed again.

However, when a time between program suspend and program resumption is long, retention occurs in the memory cells. Due to the retention, a phenomenon in which the threshold voltage of the memory cell is higher than the auxiliary verification voltage just before the program suspend, however, the threshold voltage of the memory cell is lower than the auxiliary verification voltage when the auxiliary verification operation is performed again after resuming the program occurs. In this case, in an embodiment, since a relatively low first program allowable voltage is applied to the bit line connected to the corresponding memory cell, a problem that the threshold voltage distribution of the memory cells is widened occurs.

A method of further including an additional latch to maintain the auxiliary verification result even in a case where the program suspend command is received may be considered. However, this increases the number of latches included in each page buffer, and becomes a factor that increases a manufacturing cost and a size of the semiconductor memory device 100.

In accordance with the semiconductor memory device 100 according to an embodiment of the present disclosure, when the program suspend command is received, the auxiliary verification result is maintained in the first and second latches LAT1; 1311 and LAT2; 1312 by utilizing a data pattern of a program state in which the program verification is completed in advance. Accordingly, the auxiliary verification result may be maintained in the page buffer during program suspend without an additional latch. Hereinafter, a method of operating the semiconductor memory device 100 according to an embodiment of the present disclosure is described with reference to FIGS. 13 to 21B.

Figure 13:
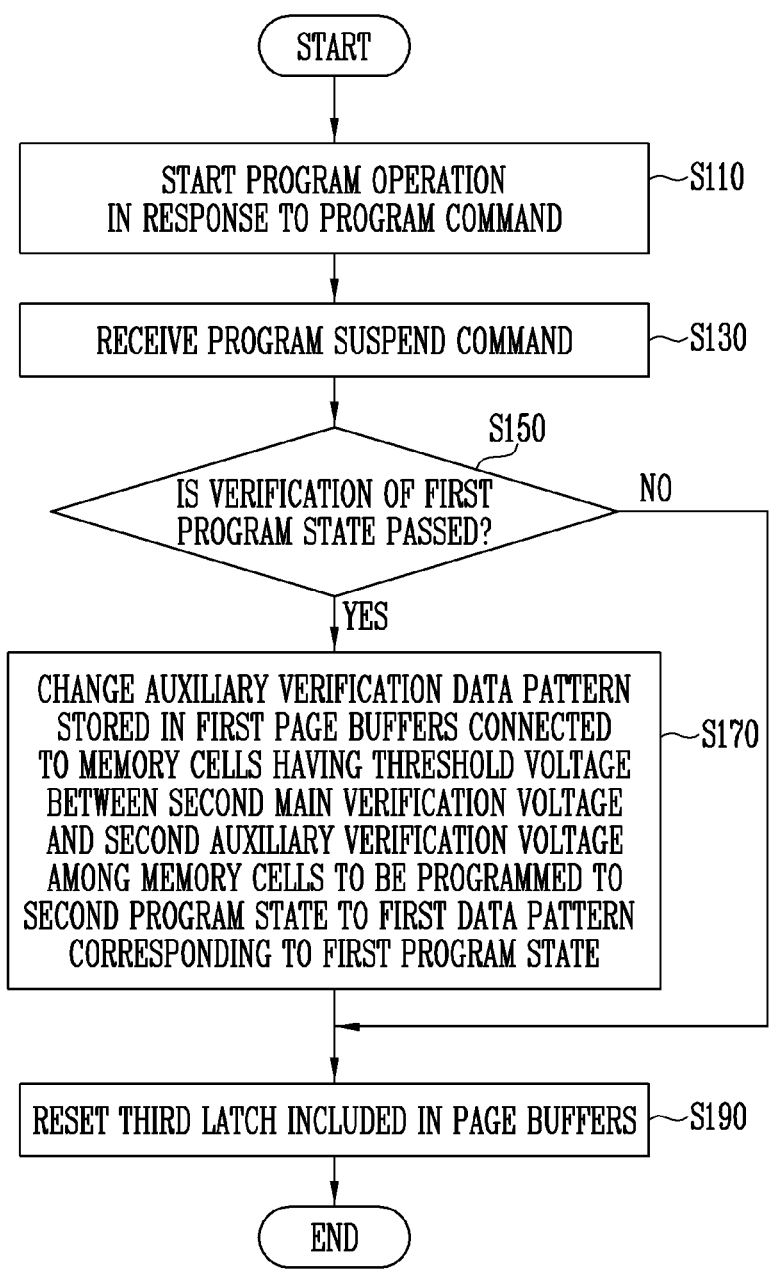
FIG. 13 is a flowchart illustrating a method of operating a semiconductor memory device according to an embodiment of the present disclosure when the program suspend command is received.
Figures 14A, 14B:
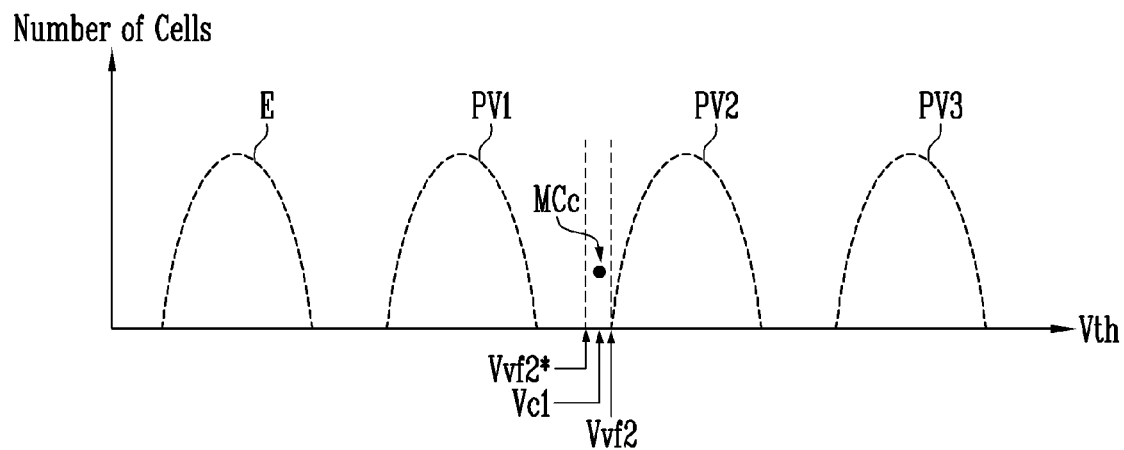
FIGS. 14A and 14B are diagrams illustrating the method according to FIG. 13 in more detail.

FIG. 13 is a flowchart illustrating a method of operating a semiconductor memory device according to an embodiment of the present disclosure when a program suspend command is received. FIGS. 14A and 14B are diagrams illustrating the method according to FIG. 13 in more detail. Hereinafter, the present disclosure is described with reference to FIGS. 13, 14A, and 14B together.

Referring to FIG. 13, the method of operating the semiconductor memory device according to an embodiment of the present disclosure includes starting the program operation in response to the program command (S110), receiving the program suspend command (S130), determining whether verification of the first program state PV1 is passed (S150), changing an auxiliary verification data pattern stored in the first page buffers connected to the memory cells having the threshold voltage between the second main verification voltage and the second auxiliary verification voltage among the memory cells to be programmed to the second program state to a first data pattern corresponding to the first program state (S170), and resetting the third latch included in the page buffers (S190).

In step S110, the semiconductor memory device 100 may start the program operation in response to the program command $CMD_{PGM}$ received from the controller 200. In this case, the semiconductor memory device 100 starts to perform the program operation on the selected memory cells, using the main verification voltages Vvf1, Vvf2, and Vvf3 and the auxiliary verification voltages Vvf1*, Vvf2*, and Vvf3* corresponding to the respective first to third program states PV1, PV2, and PV3.

In step S130, the semiconductor memory device 100 receives the program suspend command $CMD_{SUS}$ from the controller 200. In response to the program suspend command $CMD_{SUS}$, the semiconductor memory device 100 may stop the program operation. Meanwhile, the semiconductor memory device 100 determines whether a verification operation for the first program state PV1 is passed among the first to third program states PV1, PV2, and PV3. When the verification operation for the first program state PV1 is passed (S150: Yes), this means that all threshold voltages of the memory cells targeting the first program state PV1, for example, the memory cell MCb shown in FIG. 9A are higher than the first main verification voltage Vvf1. This case means that all data patterns of the first and second latches LAT1; 1311 and LAT2; 1312 in the page buffer connected to the memory cells targeting the first program state PV1 are changed to "0 0" as described with reference to FIG. 9B. In other words, all latches corresponding to the memory cell MCb, that is, the first and second latches LAT1; 1311 and LAT2; 1312 storing the data pattern of initial "1 1" store a data pattern of "0 0".

Therefore, when the verification operation for the first program state PV1 is passed (S150: Yes), among the memory cells MCc to be programmed to the second program state PV2, the data pattern stored in the first and second latches LAT1; 1311 and LAT2; 1312 in the page buffer (that is, the first page buffer of step S170) connected to memory cells of which the threshold voltage is greater than the second auxiliary verification voltage Vvf2* and less than the second main verification voltage Vvf2 is changed from "1 0" to "1 1". In step S170, the first data pattern may be a data pattern corresponding to the first program state PV1 in which the program is already completed, and may be, for example, "1 1".

Referring to FIG. 14A, the first and second latches LAT1; 1311 and LAT2; 1312 of which the data pattern is changed in step S170 corresponds to the memory cells having the threshold voltage between the second auxiliary verification voltage Vvf2* and the second main verification voltage Vvf2 among the memory cells MCc to be programmed to the second program state PV2. That is, referring to FIG. 14B, in step S170, the data pattern stored in the first and second latches LAT1; 1311 and LAT2; 1312 is changed to "1 1", with respect to the page buffers storing the data pattern of "1 0" in the first and second latches LAT1; 1311 and LAT2; 1312 and storing the bit data of "1" in the third latch LAT3; 1313, that is, the first page buffers. This is for distinguishing memory cells having the threshold voltage less than the second auxiliary verification voltage Vvf2* among the memory cells MCc to be programmed to the second program state PV2 from the memory cells having a threshold voltage between the second auxiliary verification voltage Vvf2* and the second main verification voltage Vvf2 when the program is resumed later, even though the third latch LAT3 is reset.

Since all program of the memory cells MCb targeting the first program state PV1 are completed, even though the data pattern of the first and second latches LAT1; 1311 and LAT2; 1312 corresponding to the memory cells having the threshold voltage corresponding to Vc1 among the memory cells MCc to be programmed to the second program state PV2 is changed to "1 1", the memory cells having the threshold voltage Vc1 are not confused with the memory cells MCb targeting the first program state PV1. As described above, this is because all data patterns of the first and second latches LAT1; 1311 and LAT2; 1312 corresponding to the memory cells MCb targeting the first program state PV1 are changed to "0 0". Through this, the memory cells having the threshold voltage between the second auxiliary verification voltage Vvf2* and the second main verification voltage Vvf2 among the memory cells MCc to be programmed to the second program state PV2 may be distinguished from the memory cells having the threshold voltage less than the second auxiliary verification voltage Vvf2*, while the program operation is stopped. In such a method, an auxiliary verification operation result for the second program state PV2 may be maintained also in a period during which the program operation is stopped.

After step S170, the third latch LAT3; 1313 included in the page buffers PB1 to PBm is reset (S190). According to step S190, data indicating the auxiliary verification result for the first to third program states PV1, PV2, and PV3 is lost. However, the data indicating the auxiliary verification result for the second program state PV2 may be maintained by the step S170.

Meanwhile, when it is determined that the verification operation for the first program state PV1 is not passed as a result of determination of step S150 (S150: No), this means that among the page buffers corresponding to the memory cells MCb targeting the first program state PV1, the page buffer that still stores the data pattern of "1 1", that is, the first data pattern exists. In this case, when step S170 is performed, the memory cells having the threshold voltage between the second auxiliary verification voltage Vvf2* and the second main verification voltage Vvf2 among the memory cells MCc to be programmed to the second program state PV2 might not be distinguished from memory cells of which program is not completed among the cells MCb targeting the first program state PV1.

Therefore, in this case, the third latch LAT3; 1313 included in the page buffers PB1 to PBm is reset without performing the step S170 (S190). That is, when the verification operation for the first program state PV1 is not passed (S150: No), the data indicating the auxiliary verification result for the second program state PV2 might not be maintained during the program suspend. Although not shown in FIG. 13, after step S190, the semiconductor memory device 100 may receive the read command from the controller 200 to perform the read operation.

FIG. 15 is a flowchart illustrating a method of operating a semiconductor memory device according to an embodiment of the present disclosure when a program resume command is received. FIG. 16 is a diagram illustrating the method according to FIG. 15 in more detail. Hereinafter, the present disclosure is described with reference to FIGS. 15 and 16 together.

Referring to FIG. 15, the method of operating the semiconductor memory device according to an embodiment of the present disclosure includes receiving the program resume command $CMD_{RSM}$ (S210), resetting the third latch LAT3; 1313 included in the page buffers (S230), determining whether the first program state is verification-passed (S250), storing the auxiliary verification data pattern corresponding to the second program state in the first page buffers (S270), and resuming the program operation (S290). After steps shown in FIG. 13 are performed, steps shown in FIG. 15 may be performed after the semiconductor memory device 100 receives the read command from the controller 200 to perform the read operation.

In step S210, the semiconductor memory device 100 receives the program resume command $CMD_{RSM}$ from the controller 200. In response to the program resume command $CMD_{RSM}$, the semiconductor memory device 100 may first reset the third latch LAT3; 1313 included in the page buffers PB1 to PBm. This is because unnecessary data may be stored in the third latch LAT3; 1313 due to a previous read operation. In an embodiment, in step S230, the third latches LAT3; 1313 included in the page buffers PB1 to PBm may be reset to store bit data of "0".

As shown in FIG. 16, the bit stored in the third latch LAT3; 1313 included in each of the page buffers PB1 to PBm becomes "0" by step S230.

In step S250, it may be determined whether the first program state PV1 is verification-passed before the program operation is stopped. To this end, when the program operation is stopped, the semiconductor memory device 100 may maintain data indicating whether verification of the first program state PV1 is passed. When the program operation is stopped and then the program resume command is received, the semiconductor memory device 100 may determine whether the verification of the first program state PV1 is passed with reference to the data. For example, the data indicating whether the verification of the first program state PV1 is passed may be stored in a specific register in the control logic 140.

When the first program state PV1 is verification-passed before the program operation is stopped (S250; Yes), step S170 of FIG. 13 may be performed in response to the program suspend command. Therefore, in response to performance of step S170, the data indicating the auxiliary verification result for the second program state PV2 is restored. Specifically, through step S270, the first page buffers are identified, and the auxiliary verification data pattern corresponding to the second program state is stored in the first page buffers.

As described above with reference to FIG. 13, the first page buffers refer to the page buffers connected to the memory cells having the threshold voltage between the second main verification voltage Vvf2 and the second auxiliary verification voltage Vvf2* among the memory cells MCc to be programmed to the second program state PV2. "1 1" which is the first data pattern may be stored in the first and second latches LAT1; 1311 and LAT2; 1312 included in the first page buffers, by step S170. As described above, the first data pattern is a data pattern corresponding to the first program state PV1. Therefore, the page buffers in which "1 1" which is the first data pattern is stored in the first and second latches LAT1; 1311 and LAT2; 1312 may be identified as the first page buffers.

In step S270, the auxiliary verification data pattern corresponding to the second program state is stored in the identified first page buffers. The auxiliary verification data pattern corresponding to the second program state PV2 is a data pattern corresponding to the threshold voltage of Vc1 in a table of FIG. 10B and is "1 0 1". That is, in step S270, the data pattern of "1 0 1" is stored in the first to third latches LAT1; 1311, LAT2; 1312, and LAT3; 1313 of the first page buffers.

Accordingly, as shown in FIG. 16, the auxiliary verification data corresponding to the second program state PV2 may be restored by performing step S270.

A method of maintaining the auxiliary verification result for the second program state PV2 during the program suspend when the first program state PV1 is verification-passed is described through FIGS. 13 to 16. However, the present disclosure is not limited thereto, and when the first program state PV1 is verification-passed, an auxiliary verification result for the third program state PV3 may be maintained during the program suspend. In a case of such an embodiment, during the program suspend, instead of step S170 of FIG. 13, a step of changing the auxiliary verification data pattern stored in the first page buffers connected to the memory cells having the threshold voltage between the third main verification voltage and the third auxiliary verification voltage among the memory cells to be programmed to the third program state to the first data pattern corresponding to the first program state may be performed. In addition, when the program is resumed, instead of step S270 of FIG. 15, a step of identifying the first page buffers and storing the auxiliary verification data pattern corresponding to the third program state in the first page buffers may be performed.

In addition, a method of maintaining the auxiliary verification result for the second program state PV2 during the program suspend when the first program state PV1 is verification-passed is described through FIGS. 13 to 16. In another embodiment, when the first and second program states PV1 and PV2 are verification-passed, the auxiliary verification result for the third program state PV3 may be maintained. Hereinafter, the present disclosure is described with reference to FIGS. 17A to 18B.

Figure 17A:
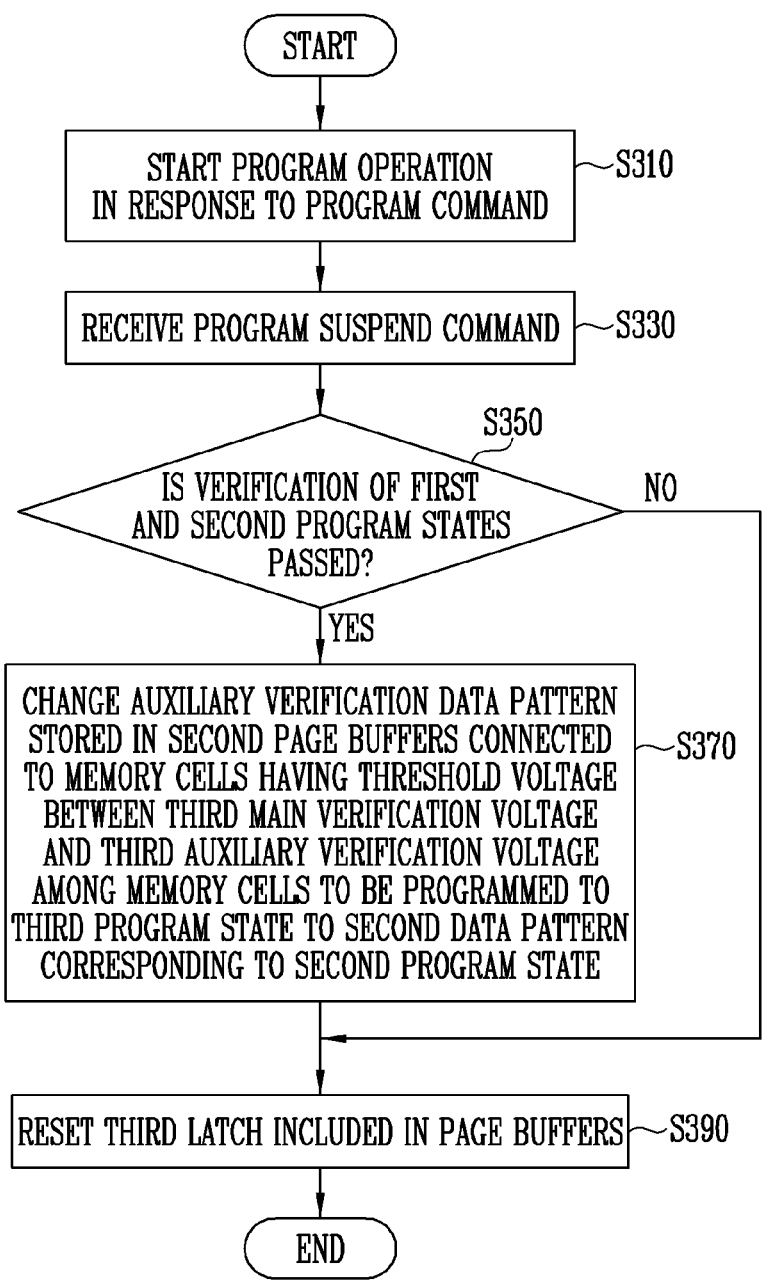
FIG. 17A is a flowchart illustrating a method of operating a semiconductor memory device according to another embodiment of the present disclosure when the program suspend command is received.

FIG. 17A is a flowchart illustrating a method of operating a semiconductor memory device according to another embodiment of the present disclosure when the program suspend command is received. FIG. 17B is a diagram illustrating the method according to FIG. 17A in more detail. Hereinafter, the present disclosure is described with reference to FIGS. 17A and 17B together.

Referring to FIG. 17A, the method of operating the semiconductor memory device according to an embodiment of the present disclosure includes starting the program operation in response to the program command (S310), receiving the program suspend command (S330), determining whether verification of the first and second program states PV1 and PV2 is passed (S350), changing an auxiliary verification data pattern stored in the second page buffers connected to the memory cells having the threshold voltage between the third main verification voltage and the third auxiliary verification voltage among the memory cells to be programmed to the third program state to a second data pattern corresponding to the second program state (S370), and resetting the third latch included in the page buffers (S390). In FIG. 17A, steps S310, S330, and S390 may be steps substantially the same as steps S110, S130, and S190 of FIG. 13. Therefore, a repetitive description is omitted.

In step S350, it is determined whether all verifications of the first and second program states PV1 and PV2 are passed. When all verifications of the first and second program states PV1 and PV2 are passed (S350: Yes), the auxiliary verification data pattern corresponding to the third program state may be changed to any one of the first data pattern corresponding to the first program state PV1 or the second data pattern corresponding to the second program state PV2. This is because all data patterns of the page buffer connected to the memory cells corresponding to the first and second program states PV1 and PV2 are changed to "0 0". In an example of FIG. 17A, when all verifications for the first and second program states PV1 and PV2 are passed (S350: Yes), the auxiliary verification data pattern stored in the second page buffers connected to the memory cells having the threshold voltage between the third main verification voltage Vvf3 and the third auxiliary verification voltage Vvf3* among the memory cells to be programmed to the third program state PV3 is changed to the second data pattern corresponding to the second program state PV2.

Referring to FIG. 17B, data stored in the first and second latches LAT1; 1311 and LAT2; 1312 of the page buffer connected to the memory cells corresponding to the threshold voltage of Vd1 among the memory cells MCd to be programmed to the third program state PV3 is changed from "0 1" to "1 0" by step S370. Accordingly, even though the third latch LAT3; 1313 of the page buffers PB1 to PBm is reset by the program suspend command, the memory cells corresponding to the threshold voltage of Vd1 among the memory cells MCd to be programmed to the third program state PV3 may be distinguished from the memory cells corresponding to the threshold voltage of Vd0. That is, even though the third latch LAT3; 1313 of the page buffers PB1 to PBm is reset by the program suspend command, the auxiliary verification result for the third program state PV3 may be maintained.

Figure 18A:
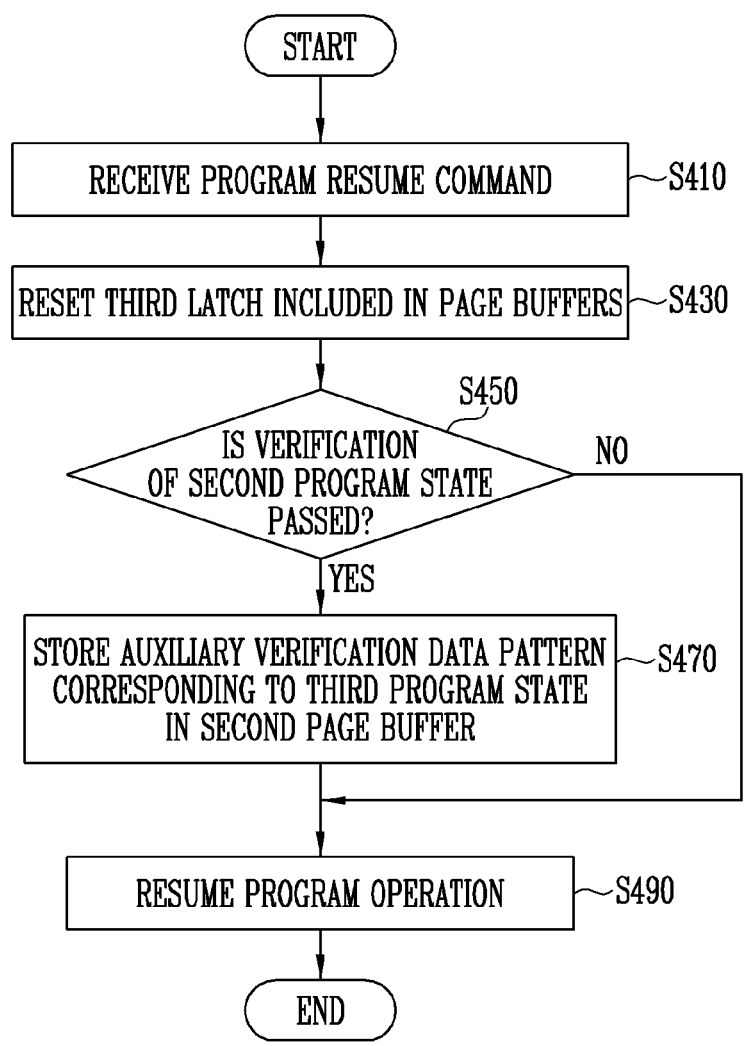
FIG. 18A is a flowchart illustrating a method of operating a semiconductor memory device according to another embodiment of the present disclosure when the program resume command is received.

FIG. 18A is a flowchart illustrating a method of operating a semiconductor memory device according to another embodiment of the present disclosure when the program resume command is received. FIG. 18B is a diagram illustrating the method according to FIG. 18A in more detail. Hereinafter, the present disclosure is described with reference to FIGS. 18A and 18B together.

Referring to FIG. 18A, the method of operating the semiconductor memory device according to an embodiment of the present disclosure includes receiving the program resume command $CMD_{RSM}$ (S410), resetting the third latch LAT3; 1313 included in the page buffers (S430), determining whether the second program state is verification-passed (S450), storing the auxiliary verification data pattern corresponding to the third program state in second page buffers (S470), and resuming the program operation (S490). In FIG. 18A, steps S410, S430, and S490 may be steps substantially the same as steps S210, S230, and S290 of FIG. 15. Therefore, a repetitive description is omitted.

In step S410, the semiconductor memory device 100 receives the program resume command $CMD_{RSM}$ from the controller 200. In response to the program resume command $CMD_{RSM}$, the semiconductor memory device 100 may first reset the third latch LAT3; 1313 included in the page buffers PB1 to PBm. This is because unnecessary data may be stored in the third latch LAT3; 1313 due to a previous read operation. In an embodiment, in step S230, the third latch LAT3; 1313 included in the page buffers PB1 to PBm may be reset to store bit data of "0".

As shown in FIG. 18B, the bit stored in the third latch LAT3; 1313 included in each of the page buffers PB1 to PBm becomes "0" by step S430.

In step S450, it may be determined whether the second program state PV2 is verification-passed before the program operation is stopped. To this end, when the program operation is stopped, the semiconductor memory device 100 may maintain data indicating whether verification of the second program state PV2 is passed. When the program operation is stopped and then the program resume command is received, the semiconductor memory device 100 may determine whether the verification of the second program state PV2 is passed with reference to the data. For example, the data indicating whether the verification of the second program state PV2 is passed may be stored in a specific register in the control logic 140.

When the second program state PV2 is verification-passed before the program operation is stopped (S450; Yes), step S370 of FIG. 17A may be performed in response to the program suspend command. Therefore, in response to performance of step S370, the data indicating the auxiliary verification result for the third program state PV3 is restored. Specifically, through step S470, the second page buffers are identified, and the auxiliary verification data pattern corresponding to the third program state is stored in the second page buffers.

The second page buffers refer to the page buffers connected to the memory cells having the threshold voltage between the third main verification voltage Vvf3 and the third auxiliary verification voltage Vvf3* among the memory cells MCd to be programmed to the third program state PV3. In step S470, the auxiliary verification data pattern corresponding to the third program state is stored in the identified second page buffers. The auxiliary verification data pattern corresponding to the third program state PV3 is a data pattern corresponding to the threshold voltage of Vd1 in a table of FIG. 11B and is "0 1 1". That is, in step S470, the data pattern of "0 1 1" is stored in the first to third latches LAT1; 1311, LAT2; 1312, and LAT3; 1313 of the second page buffers.

Accordingly, as shown in FIG. 18B, the auxiliary verification data corresponding to the third program state PV3 may be restored by performing step S470.

In the above description, a method of maintaining an auxiliary verification result for a partial program state when the program suspend command is received during the program operation of the MLC is described. However, the present disclosure is not limited thereto, and may be applied to a triple-level cell (TLC), a quad-level cell (QLC), and memory cells that store five bits or more of data. Hereinafter, the present disclosure applied to the TLC is described with reference to FIGS. 19 to 21B.

Figure 19:
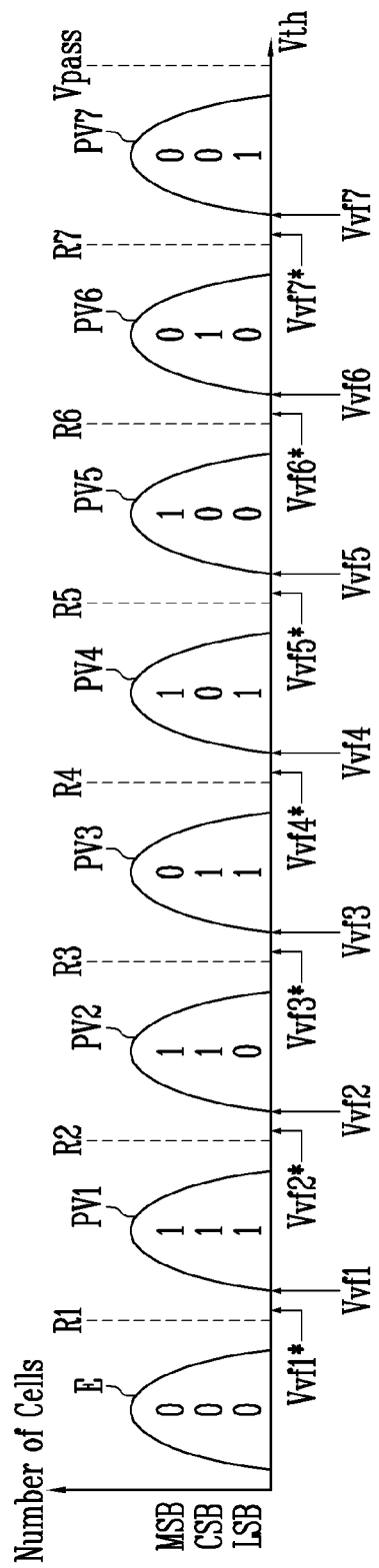
FIG. 19 is a diagram illustrating a threshold voltage distribution of a triple-level cell (TLC), and a main verification voltage and an auxiliary verification voltage for forming the threshold voltage distribution.

FIG. 19 is a diagram illustrating a threshold voltage distribution of the TLC, and a main verification voltage and an auxiliary verification voltage for forming the threshold voltage distribution.

Referring to FIG. 19, a data pattern stored in the TLC and a threshold voltage distribution of target states corresponding thereto are shown, for example. The TLC stores three bits of data including a most significant bit (MSB), a central significant bit (CSB), and a least significant bit (LSB). In an example of FIG. 19, the memory cell corresponding to the erase state E may store a data pattern of "0 0 0", and the memory cells corresponding to the first to seventh program states PV1 to PV7 may store data patterns of "1 1 1", "1 1 0", "0 1 1", "1 0 1", "1 0 0", "0 1 0", and "0 0 1", respectively. However, this is an example, and data patterns of various other combinations may be applied.

In order to read data of the TLC, first to seventh read voltages R1 to R7 may be used. Meanwhile, the pass voltage Vpass is applied to the unselected word line.

During program verification operation, main verification voltages Vvf1, Vvf2, Vvf3, Vvf4, Vvf5, Vvf6, and Vvf7 and auxiliary verification voltages Vvf1*, Vvf2*, Vvf3*, Vvf4*, Vvf5*, Vvf6*, and Vvf7* may be used. The auxiliary verification voltages Vvf1*, Vvf2*, Vvf3*, Vvf4*, Vvf5*, Vvf6*, and Vvf7* may be voltages for distinguishing memory cells near the main verification voltages Vvf1, Vvf2, Vvf3, Vvf4, Vvf5, Vvf6, and Vvf7 corresponding to the target state. By lowering a threshold voltage shift width of the memory cells near the main verification voltages Vvf1, Vvf2, Vvf3, Vvf4, Vvf5, Vvf6, and Vvf7, the threshold voltage distribution width of each of the program states PV1 to PV7 may be narrowed.

Figure 20:
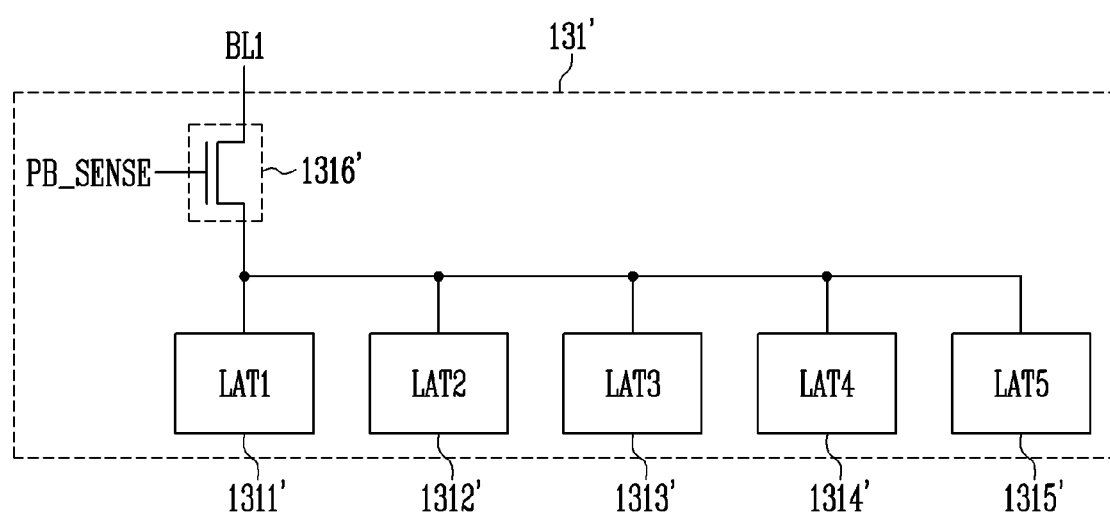
FIG. 20 is a diagram schematically illustrating a page buffer according to another embodiment of the present disclosure.

FIG. 20 is a diagram schematically illustrating a page buffer 131' according to another embodiment of the present disclosure. Specifically, the page buffer 131' is an embodiment of the page buffer PB1 connected to the first bit line BL1 among the page buffers PB1 to PBm shown in FIG. 2. Other page buffers PB2 to PBm may also be configured similarly to the page buffer 131' shown in FIG. 20.

Referring to FIG. 20, the page buffer 131' may include a plurality of latches 1311', 1312', and 1313' for storing program data input from the outside during the program operation. For example, in the embodiment shown in FIG. 20, the page buffer 131' may store three bits of data. In this case, the first latch LAT1; 1311' may store MSB, the second latch LAT2; 1312' may store CSB, and the third latch LAT3; 1313' may store the LSB. Until program of the memory cell connected to the first bit line BL1 is completed, the first to third latches 1311', 1312', and 1313' may maintain the stored data pattern.

Meanwhile, the page buffer 131' may further include a fourth latch LAT4; 1314' and a fifth latch LAT5; 1315'. The fourth latch LAT4; 1314' may store data indicating the auxiliary verification result of the memory cell connected to the first bit line BL1. The fifth latch LAT5; 1315' may be used for the sensing operation of the first bit line BL1 for the verification operation.

Figure 21A:
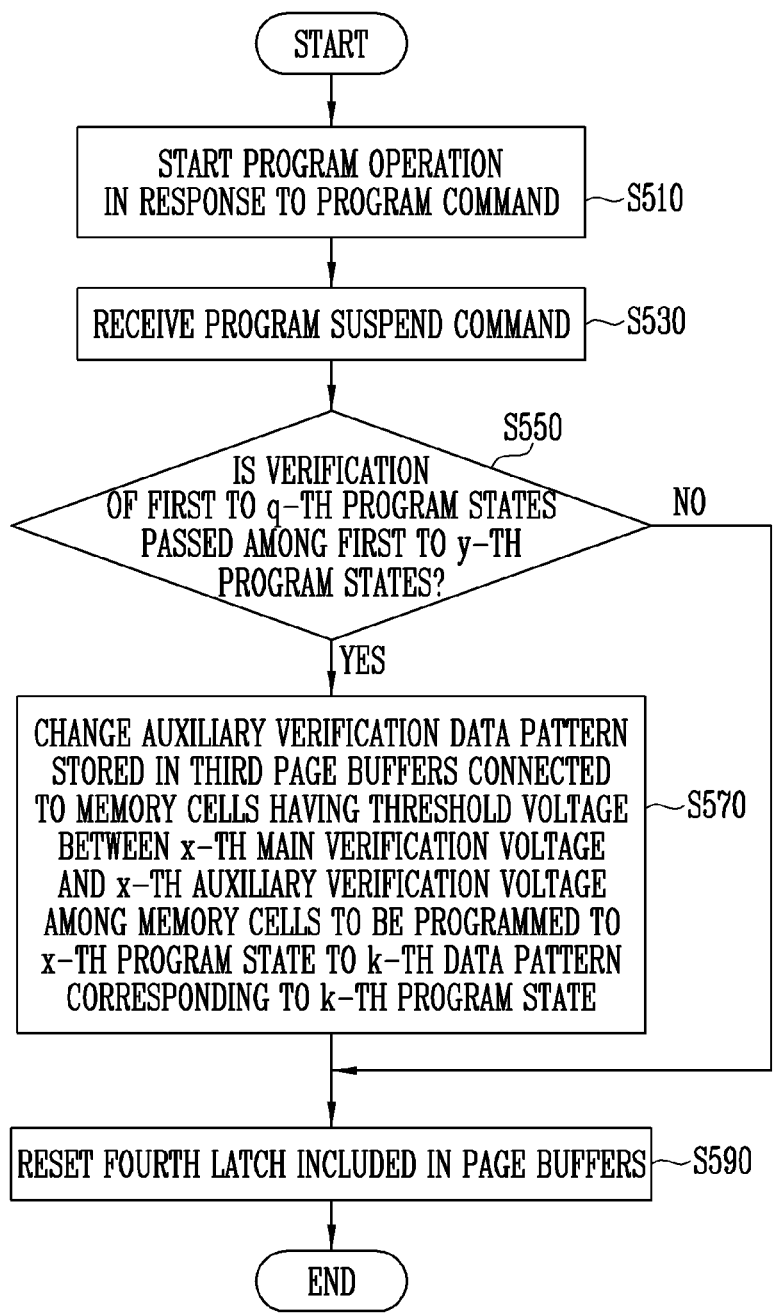
FIG. 21A is a flowchart illustrating a method of operating a semiconductor memory device according to still another embodiment of the present disclosure when the program suspend command is received.

FIG. 21A is a flowchart illustrating a method of operating a semiconductor memory device according to still another embodiment of the present disclosure when the program suspend command is received. Referring to FIG. 21A, the method of operating the semiconductor memory device according to an embodiment of the present disclosure includes starting the program operation in response to the program command (S510), receiving the program suspend command (S530), determining whether verification of first to q-th program states among first to y-th program states is passed (S550), changing an auxiliary verification data pattern stored in third page buffers connected to memory cells having a threshold voltage between an x-th main verification voltage and an x-th auxiliary verification voltage among memory cells to be programmed to an x-th program state to a k-th data pattern corresponding to a k-th program state among the first to q-th program states (S570), and resetting the fourth latch included in the page buffers (S590). In FIG. 21A, a repetitive description of steps S510, S530, and S590 is omitted.

In step S550, the y-th program state may mean the highest program state. In the TLC, a value of y may be 7. In the QLC, the value of y may be 15. Meanwhile, a value of q may be greater than 1 and less than y.

In step S570, the x-th program state may be a program state higher than the q-th program state. That is, x may be greater than q and less than or equal to y. Meanwhile, a value of k may be greater than or equal to 1 and less than or equal to q.

That is, an auxiliary verification result of any one program state PVx among program states of which program is not completed may be maintained, by using the k-th data pattern corresponding to any one PVk among program states PV1 to PVq of which verification is passed, by steps shown in FIG. 21A.

Figure 21B:
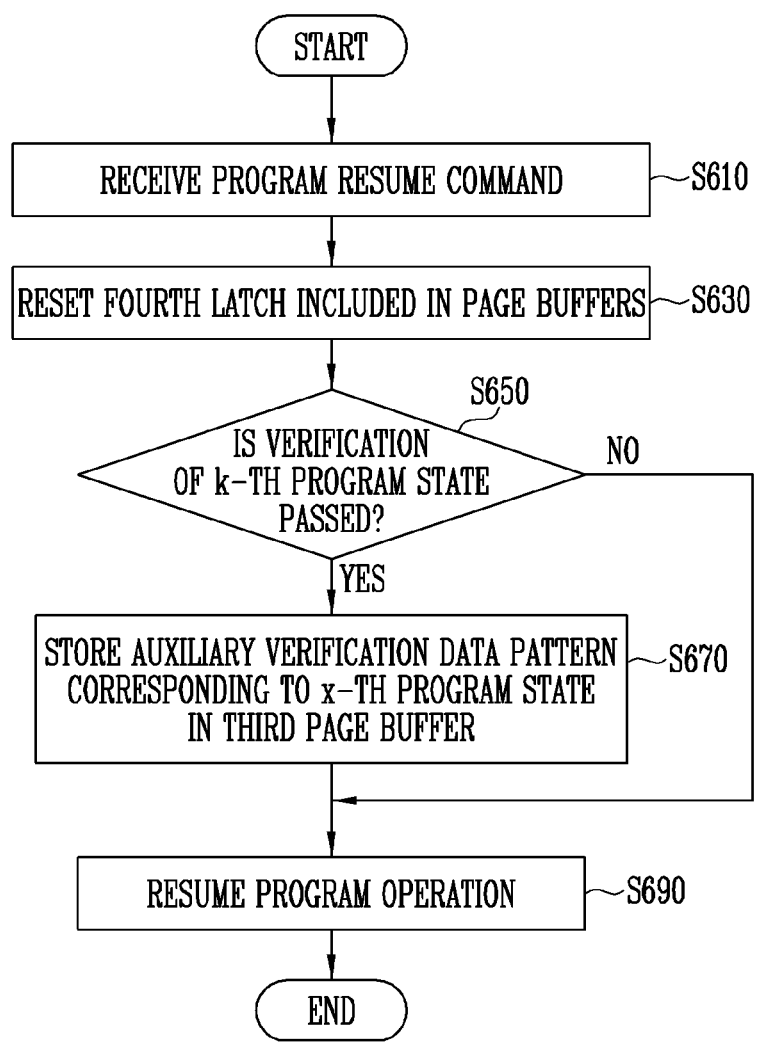
FIG. 21B is a flowchart illustrating a method of operating a semiconductor memory device according to still another embodiment of the present disclosure when the program resume command is received.

FIG. 21B is a flowchart illustrating a method of operating a semiconductor memory device according to still another embodiment of the present disclosure when the program resume command is received.

Referring to FIG. 21B, the method of operating the semiconductor memory device according to an embodiment of the present disclosure includes receiving the program resume command $CMD_{RSM}$ (S610), resetting the fourth latch LAT4; 1314' included in the page buffers (S630), determining whether the k-th program state is verification-passed (S650), storing the auxiliary verification data pattern corresponding to the x-th program state in the third page buffers (S670), and resuming the program operation (S690). In FIG. 21B, a repetitive description of steps S610, S630, and S690 is omitted.

In step S650, it may be determined whether the k-th program state PVk is verification-passed before the program operation is stopped. When the k-th program state PVk is verification-passed before the program operation is stopped (S650; Yes), the third page buffers are identified, and the auxiliary verification data pattern corresponding to the x-th program state is stored in the third page buffers. Accordingly, the auxiliary verification data corresponding to the x-th program state PVx may be restored by performing step S670.

Figure 22:
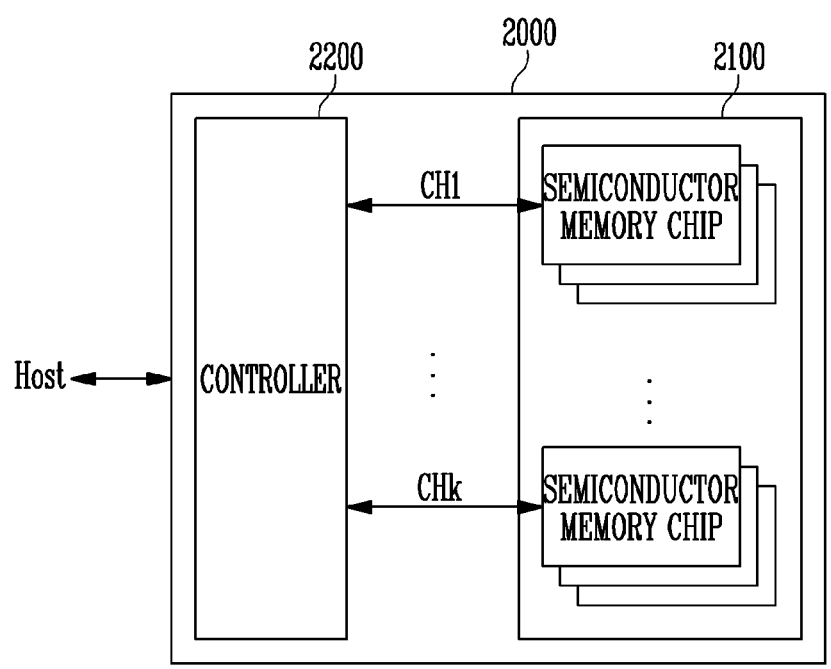
FIG. 22 is a block diagram illustrating an application example of the storage device of FIG. 1.

FIG. 22 is a block diagram illustrating an application example of the storage device of FIG. 1.

Referring to FIG. 22, the storage device 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 22, the plurality of groups communicate with the controller 2200 through first to k-th channels CH1 to CHk, respectively. Each semiconductor memory chip may be configured and may be operated similarly to one of the semiconductor memory devices 100 described with reference to FIG. 2.

Each group is configured to communicate with the controller 2200 through one common channel. The controller 2200 is configured to control the plurality of memory chips of the semiconductor memory device 2100 through the plurality of channels CH1 to CHk.

In FIG. 22, the plurality of semiconductor memory chips are connected to one channel. However, it may be understood that the storage device 2000 may be modified so that one semiconductor memory chip is connected to one channel.

Figure 23:
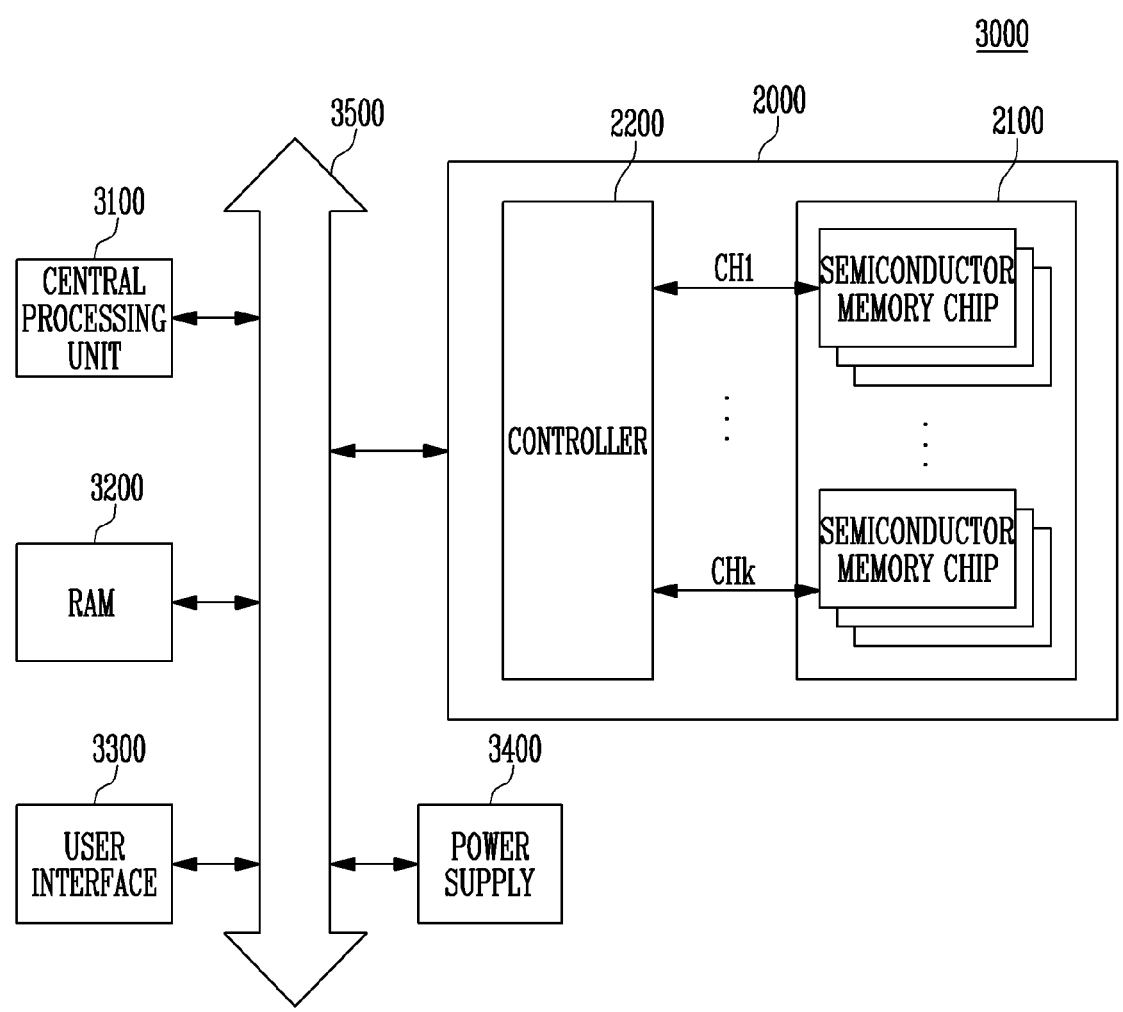
FIG. 23 is a block diagram illustrating a computing system including the storage device described with reference to FIG. 22.

FIG. 23 is a block diagram illustrating a computing system including the storage device described with reference to FIG. 22.

Referring to FIG. 23, the computing system 3000 includes a central processing unit 3100, a random access memory (RAM) 3200, a user interface 3300, a power supply 3400, a system bus 3500, and the storage device 2000.

The storage device 2000 is electrically connected to the central processing unit 3100, the RAM 3200, the user interface 3300, and the power supply 3400 through the system bus 3500. Data provided through the user interface 3300 or processed by the central processing unit 3100 is stored in the storage device 2000.

In FIG. 23, the semiconductor memory decice 2100 is connected to the system bus 3500 through the controller 2200. However, the semiconductor memory device 2100 may be configured to be directly connected to the system bus 3500. At this time, a function of the controller 2200 is performed by the central processing unit 3100 and the RAM 3200.

In FIG. 23, the storage device 2000 described with reference to FIG. 22 is provided. However, the storage device 2000 may be replaced with the storage device 1000 described with reference to FIG. 1. As an embodiment, the computing system 3000 may be configured to include both of the storage devices 1000 and 2000 described with reference to FIGS. 1 and 22.

What is claimed is:

1. A method of operating a semiconductor memory device, the method comprising:
    starting a program operation on selected memory cells using a main verification voltage and an auxiliary verification voltage in response to a program command;
    receiving a program suspend command during the program operation; and
    changing at least one auxiliary voltage verification result information among threshold voltage states which are not program-passed to at least one data pattern among threshold voltage states which program-passed, in response to the program suspend command.

2. The method of claim 1, wherein the semiconductor memory device includes a multi-level cell (MLC), and changing at least one auxiliary voltage verification result information among the threshold voltage states which are not program-passed to at least one data pattern among the threshold voltage states which program-passed, in response to the program suspend command comprises:
    determining whether a verification operation for a first program state among first to third program states is passed; and
    changing a data pattern stored in a page buffer corresponding to memory cells having a threshold voltage between a second auxiliary verification voltage and a second main verification voltage to a first data pattern corresponding to the first program state, among memory cells to be programmed to the second program state.

3. The method of claim 2, further comprising:
    receiving a program resume command;
    determining whether the first program state is verification-passed; and
    storing an auxiliary verification data pattern corresponding to the second program state in the page buffer.

4. The method of claim 1, wherein the semiconductor memory device includes a multi-level cell (MLC), and the changing of the at least one auxiliary voltage verification result information among the threshold voltage states which are not program-passed to the at least one data pattern among the threshold voltage states which program-passed, in response to the program suspend command comprises:
    determining whether a verification operation for a first program state among first to third program states is passed; and
    changing a data pattern stored in a page buffer corresponding to memory cells having a threshold voltage between a third auxiliary verification voltage and a third main verification voltage to a first data pattern corresponding to the first program state, among memory cells to be programmed to the third program state.

5. The method of claim 4, further comprising:
    receiving a program resume command;
    determining whether the first program state is verification-passed; and
    storing an auxiliary verification data pattern corresponding to the third program state in the page buffer.

6. The method of claim 1, wherein the semiconductor memory device includes a multi-level cell (MLC), and the changing of the at least one auxiliary voltage verification result information among the threshold voltage states which are not program-passed to the at least one data pattern among the threshold voltage states which program-passed, in response to the program suspend command comprises:
    determining whether a verification operation for a second program state among first to third program states is passed; and
    changing a data pattern stored in a page buffer corresponding to memory cells having a threshold voltage between a third auxiliary verification voltage and a third main verification voltage to a first data pattern corresponding to the first program state, among memory cells to be programmed to the third program state.

7. The method of claim 6, further comprising:
    receiving a program resume command;
    determining whether the second program state is verification-passed; and
    storing an auxiliary verification data pattern corresponding to the third program state in the page buffer.

8. The method of claim 1, wherein the semiconductor memory device includes a multi-level cell (MLC), and the changing of the at least one auxiliary voltage verification result information among the threshold voltage states which are not program-passed to the at least one data pattern among the threshold voltage states which program-passed, in response to the program suspend command comprises:
    determining whether a verification operation for a second program state among first to third program states is passed; and
    changing a data pattern stored in a page buffer corresponding to memory cells having a threshold voltage between a third auxiliary verification voltage and a third main verification voltage to a second data pattern corresponding to the second program state, among memory cells to be programmed to the third program state.

9. The method of claim 8, further comprising:
    receiving a program resume command;
    determining whether the second program state is verification-passed; and storing an auxiliary verification data pattern corresponding to the third program state in the page buffer.

10. The method of claim 1, wherein the semiconductor memory device includes a triple-level cell (TLC), and the changing of the at least one auxiliary voltage verification result information among the threshold voltage states which are not program-passed to the at least one data pattern among the threshold voltage states which program-passed, in response to the program suspend command comprises:

determining whether a verification operation for an k-th program state among first to seventh program states is passed; and changing a data pattern stored in a page buffer corresponding to memory cells having a threshold voltage between an x-th auxiliary verification voltage and an x-th main verification voltage to a k-th data pattern corresponding to the k-th program state, among memory cells to be programmed to an x-th program state wherein k is an integer greater than 1 and less than or equal to 6, and x is an integer greater than k and less than or equal to 7.

11. The method of claim 10, further comprising:
receiving a program resume command;
determining whether the k-th program state is verification-passed; and
storing an auxiliary verification data pattern corresponding to the x-th program state in the page buffer.

12. The method of claim 1, wherein the semiconductor memory device includes memory cells each storing an N-bit, and the changing of the at least one auxiliary voltage verification result information among the threshold voltage states which are not program-passed to the at least one data pattern among the threshold voltage states which program-passed, in response to the program suspend command comprises:

determining whether a verification operation for a k-th program state among first to $(2^N-1)$-th program states is passed; and changing a data pattern stored in a page buffer corresponding to memory cells having a threshold voltage between an x-th auxiliary verification voltage and an x-th main verification voltage to a k-th data pattern corresponding to a k-th program state, among memory cells to be programmed to an x-th program state (k is an integer greater than 1 and less than or equal to $2^N-2$, and x is an integer greater than k and less than or equal to $2^N-1$).

13. The method of claim 12, further comprising:
receiving a program resume command;
determining whether the k-th program state is verification-passed; and
storing an auxiliary verification data pattern corresponding to the x-th program state in the page buffer.

14. A method of operating a semiconductor memory device including memory cells each storing an N-bit, the method comprising:
receiving a program resume command;
determining whether a k-th program state among first to $(2^N-1)$-th program states is verification-passed; and identifying page buffers corresponding to memory cells having a threshold voltage between an x-th auxiliary verification voltage and an x-th main verification voltage among memory cells to be programmed to an x-th program state, and storing an auxiliary verification data pattern corresponding to the x-th program state in the identified page buffers (N is an integer greater than 1, k is an integer greater than 1 and less than or equal to $2^N-2$, and x is an integer greater than k and less than or equal to $2^N-1$).

15. The method of claim 14, wherein the auxiliary verification data pattern is a data pattern capable of distinguishing between memory cells having the threshold voltage between the x-th auxiliary verification voltage and the x-th main verification voltage, and remaining memory cells.

16. The method of claim 14, further comprising:
resuming a program operation after storing the auxiliary verification data pattern corresponding to the x-th program state in the identified page buffers.

17. A semiconductor memory device comprising:
a memory cell array including a plurality of memory cells each storing an N-bit;
a peripheral circuit configured to perform a program operation on the memory cell array; and
control logic configured to control the program operation of the peripheral circuit,
wherein the control logic controls the peripheral circuit to change auxiliary voltage verification result information corresponding to an x-th threshold voltage state that is not program-passed among first to $(2^N-1)$-th program states to a k-th data pattern corresponding to a k-th program state that is program-passed among the first to $(2^N-1)$-th program states, when a program suspend command is received during a program operation on selected memory cells among the plurality of memory cells (N is an integer greater than 1, k is an integer greater than 1 and less than or equal to $2^N-2$, and x is an integer greater than k and less than or equal to $2^N-1$).

18. The semiconductor memory device of claim 17, wherein the control logic controls the peripheral circuit to identify first page buffers corresponding to memory cells having a threshold voltage between an x-th auxiliary verification voltage and an x-th main verification voltage corresponding to the x-th threshold voltage state, and change a data pattern stored in the identified first page buffers to the k-th data pattern.

19. The semiconductor memory device of claim 18, wherein the control logic controls the peripheral circuit to identify the first page buffers and store an auxiliary verification data pattern corresponding to the x-th program state in the first page buffers, when a program resume command is received.

20. The semiconductor memory device of claim 19, wherein the control logic controls the peripheral circuit to resume the program operation on the selected memory cells using the x-th auxiliary verification voltage and the x-th main verification voltage, after storing the auxiliary verification data pattern corresponding to the x-th program state in the first page buffers.

* * * * *